(12) United States Patent
Yu

(10) Patent No.: US 11,586,387 B2
(45) Date of Patent: Feb. 21, 2023

(54) MEMORY SYSTEM

(71) Applicant: SK hynix Inc., Gyeonggi-do (KR)

(72) Inventor: Hyung Seok Yu, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 13 days.

(21) Appl. No.: 17/325,772

(22) Filed: May 20, 2021

(65) Prior Publication Data
US 2022/0147275 A1    May 12, 2022

(30) Foreign Application Priority Data
Nov. 11, 2020 (KR) .................. 10-2020-0150244

(51) Int. Cl.
| | |
|---|---|
| *G11C 16/04* | (2006.01) |
| *G06F 3/06* | (2006.01) |
| *G11C 11/56* | (2006.01) |
| *G11C 16/10* | (2006.01) |
| *G11C 16/26* | (2006.01) |
| *G11C 16/24* | (2006.01) |
| *H01L 27/11582* | (2017.01) |
| *H01L 27/11556* | (2017.01) |

(52) U.S. Cl.
CPC .......... *G06F 3/0659* (2013.01); *G06F 3/0604* (2013.01); *G06F 3/0679* (2013.01); *G11C 11/5642* (2013.01); *G11C 11/5671* (2013.01); *G11C 16/0483* (2013.01); *G11C 16/10* (2013.01); *G11C 16/24* (2013.01); *G11C 16/26* (2013.01); *H01L 27/11556* (2013.01); *H01L 27/11582* (2013.01)

(58) Field of Classification Search
CPC ............ G11C 11/5642; G11C 11/5671; G11C 16/0483; G11C 16/10; G11C 16/24; G11C 16/26
See application file for complete search history.

(56) References Cited

U.S. PATENT DOCUMENTS

| | | | |
|---|---|---|---|
| 2019/0096485 A1* | 3/2019 | Jung | G11C 7/02 |
| 2022/0013176 A1* | 1/2022 | Du | G11C 16/08 |
| 2022/0101933 A1* | 3/2022 | Choi | G11C 16/10 |

FOREIGN PATENT DOCUMENTS

| | | |
|---|---|---|
| KR | 10-0965073 B1 | 6/2010 |
| KR | 10-2019-0052436 A | 5/2019 |

* cited by examiner

*Primary Examiner* — Pho M Luu
(74) *Attorney, Agent, or Firm* — IP & T Group LLP

(57) ABSTRACT

Provided herein may be a memory system. The memory system may include a memory device including a memory block and a peripheral circuit, and a memory controller configured to transmit a program command based on a single-level cell scheme to the memory device so as to increase threshold voltages of the selection transistors included in the memory block after an erase operation has been performed on the memory block, and transmit, to the memory device, a read command to perform a check operation, wherein the read command indicates a first read voltage and a second read voltage higher than the first read voltage, and the check operation includes a check of whether the threshold voltages fall within a range between the first and second read voltages, or a check of whether the threshold voltages are lower than the first read voltage or higher than the second read voltage.

20 Claims, 23 Drawing Sheets

MEMORY SYSTEM

CROSS-REFERENCE TO RELATED APPLICATION

The present application claims priority under 35 U.S.C. § 119(a) to Korean patent application number 10-2020-0150244, filed on Nov. 11, 2020, with the Korean Intellectual Property Office, and which is incorporated herein by reference in its entirety.

BACKGROUND

Field of Invention

Various embodiments of the present disclosure generally relate to a memory system, and more particularly to a memory system including a memory device that is capable of storing data.

Description of Related Art

A memory system may include a memory device which can store data and a memory controller which can control the memory device.

Memory devices may be classified into a volatile memory device and a nonvolatile memory device.

The volatile memory device is a memory device in which data is stored only when power is supplied and in which stored data is lost when the supply of power is interrupted. Examples of the volatile memory device include a static random access memory (SRAM) and a dynamic random access memory (DRAM).

The nonvolatile memory device may be a memory device in which stored data is retained even when the supply of power is interrupted. Examples of the nonvolatile memory device include a read only memory (ROM), a programmable ROM (PROM), an electrically programmable ROM (EPROM), an electrically erasable and programmable ROM (EEPROM), and a flash memory.

SUMMARY

Various embodiments of the present disclosure are directed to a memory system that can quickly check the status of a memory device.

An embodiment of the present disclosure may provide for a memory system. The memory system may include a memory device including a memory block and a peripheral circuit, wherein the memory block includes selection transistors and memory cells coupled between a bit line and a source line, and the peripheral circuit is configured to perform a program operation or a read operation, and a memory controller configured to transmit a program command based on a single-level cell scheme to the memory device so as to increase threshold voltages of the selection transistors after an erase operation has been performed on the memory block, and transmit, to the memory device, a read command to perform a check operation, wherein the read command indicates a first read voltage and a second read voltage higher than the first read voltage, and wherein the check operation includes a check of whether the threshold voltages of the selection transistors fall within a range between the first read voltage and the second read voltage, or a check of whether the threshold voltages are lower than the first read voltage or higher than the second read voltage.

An embodiment of the present disclosure may provide for a memory system. The memory system may include a memory device including a memory block and a peripheral circuit, wherein the memory block includes selection transistors and memory cells coupled between a bit line and a source line and the peripheral circuit is configured to program or read the selection transistors, and a memory controller configured to transmit a command to check threshold voltage distributions of the selection transistors to the memory device, wherein the peripheral circuit is further configured to store first data that is read from the selection transistors using a first read voltage and configured to flip data that is read from the selection transistors using a second read voltage higher than the first read voltage and store flipped data as second data, in response to the command, and wherein the memory controller is further configured to, when the first data and the second data are output from the memory device, check a status of the memory block depending on a number of fail bits included in the first data and the second data.

DETAILED DESCRIPTION

Figure 1:
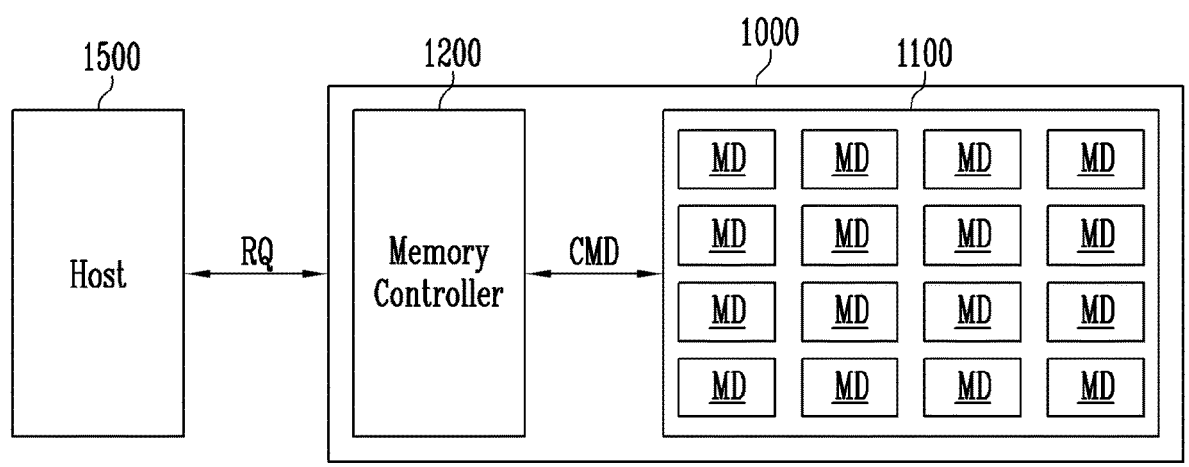
FIG. 1 is a diagram illustrating a memory system according to an embodiment of the present disclosure.

FIG. 1 is a diagram illustrating a memory system according to an embodiment of the present disclosure.

Referring to FIG. 1, a memory system 1000 may include a storage device 1100 and a memory controller 1200. The storage device 1100 may include a plurality of memory devices MD, which may be coupled to the memory controller 1200 through input/output lines.

The memory controller 1200 may perform communication between a host 1500 and the memory devices MD. The memory controller 1200 may generate a command CMD for controlling the memory devices MD in response to requests RQ from the host 1500, and may perform a background operation for improving the performance of the memory system 1000 even if requests RQ are not received from the host 1500.

The host 1500 may generate the requests RQ for various operations, and may output the generated requests RQ to the memory system 1000. For example, the requests RQ may include a program request for controlling a program operation, a read request for controlling a read operation, an erase request for controlling an erase operation, etc.

The host 1500 may communicate with the memory system 1000 through various interfaces, such as Peripheral Component Interconnect Express (PCIe), Advanced Technology Attachment (ATA), Serial ATA (SATA), Parallel ATA (PATA), serial attached SCSI (SAS), Non-Volatile Memory Express (NVMe), Universal Serial Bus (USB), Multi-Media Card (MMC), Enhanced Small Disk Interface (ESDI), or Integrated Drive Electronics (IDE).

The memory controller 1200 according to the present embodiment may check the status of selection transistors included in the memory devices MD. For example, the memory devices MD may include a plurality of strings coupled between bit lines and a source line, and each of the strings may include selection transistors configured to electrically couple or decouple a bit line or a source line to or from the corresponding string, and memory cells coupled between the selection transistors.

The selection transistors may be configured to have the same structure as the memory cells. Therefore, after an erase operation has been performed on a memory block, a program operation may be performed on the selection transistors so that the selection transistors become capable of performing a switching function. The program operation performed on the selection transistors may be an operation of increasing the threshold voltages of the selection transistors rather than an operation of storing data. Therefore, after the program operation has been performed on the selection transistors, the memory controller 1200 may perform a check operation of checking whether the threshold voltages of the selection transistors are distributed within a normal range.

For example, the memory controller 1200 may transmit a program command based on a single-level cell scheme to a selected memory device MD, so as to increase the threshold voltages of the selection transistors and transmit a read command to the memory device MD to perform a check operation. In one embodiment, the check operation may use a first read voltage and a second read voltage higher than the first read voltage in order to check whether the threshold voltages of the selection transistors are present between the first read voltage and the second read voltage. In one embodiment, the check operation may check whether the threshold voltages are lower than the first read voltage or higher than the second read voltage. An embodiment of memory controller 1200 that is capable of performing the check operation will be described in detail below.

Figure 2:
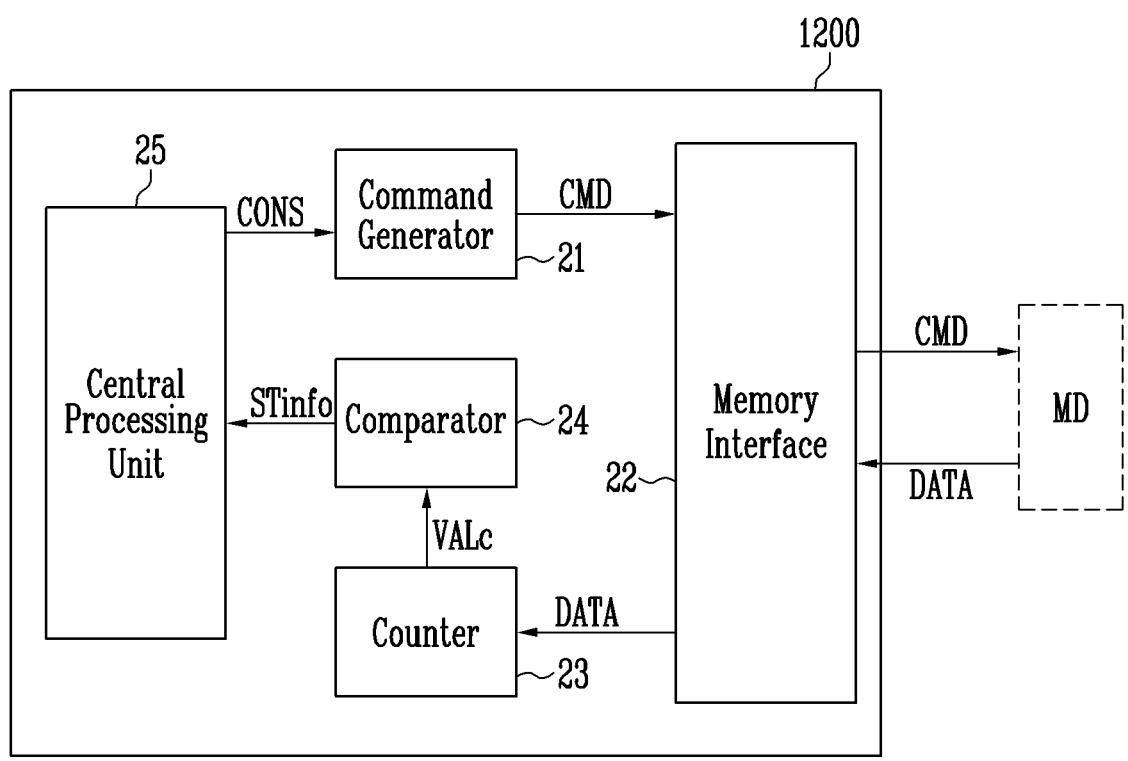
FIG. 2 is a diagram illustrating a memory controller according to an embodiment of the present disclosure.

FIG. 2 is a diagram illustrating a memory controller according to an embodiment of the present disclosure.

Referring to FIG. 2, a memory controller 1200 may include a command generator 21, a memory interface 22, a counter 23, a comparator 24, and a central processing unit (or processor) 25. The command generator 21 may generate a command CMD in response to a control signal CONS. The command generator 21 may generate a command CMD for performing a program, read or erase operation in response to the control signal CONS. In accordance with the present embodiment, the command generator 21 may generate a program command based on a single-level cell scheme and may generate a read command and then generate an output command in response to the control signal CONS for a check operation during the check operation.

For example, when the control signal CONS for the check operation is received, the command generator 21 may generate a read command based on a multi-level cell scheme. The multi-level cell scheme may be a scheme of storing and reading two bits of data in and from one memory cell and may be distinguished from a single-level cell scheme of storing and reading one bit of data in and from one memory cell. That is, when the number of bits stored in a memory cell changes, the threshold voltage distributions of memory cells changes and thus read voltages used in a read operation may also change.

In the present embodiment, a read command usable in the check operation is not limited to the multi-level cell scheme, and a read command used in a higher level cell scheme than the multi-level cell scheme may be used. For example, the command generator 21 may generate a read command based on a triple-level cell scheme of storing and reading three bits of data in and from one memory cell and may generate a read command based on a quadruple-level cell scheme of storing and reading four bits of data in and from one memory cell. Alternatively, a read command based on a scheme of storing and reading five or more bits of data in and from one memory cell may be used. The read command used in the check operation may be preset in the command generator 21 in consideration of the threshold voltages of selection transistors included in the memory device.

The memory interface 22 may transmit the command CMD generated by the command generator 21 to the selected memory device MD. For example, when a plurality of commands are generated by the command generator 21, the memory interface 22 may sequentially queue the plurality of commands, and may output the commands in the order of queuing. Also, the memory interface 22 may receive data DATA output from the memory device MD, and may transmit the received data DATA to the counter 23.

The counter 23 may count the number of items of selected data included in the data DATA transmitted from the memory interface 22, and may output a count value VALc. For example, the counter 23 may count the number of fail bits included in the data DATA. The fail bit may be selected as one of data '1' or data '0'. In the present embodiment, the case where data '1' is set as the fail bit is described by way of example.

The comparator 24 may compare the count value VALc with a reference value, and may generate and output status information STinfo of the memory block based on the result of the comparison. For example, when the count value VALc is greater than the reference value, the comparator 24 may output status information STinfo indicating bad status. When the count value VALc is less than or equal to the reference value, the comparator 24 may output status information STinfo indicating normal status. Alternatively, the comparator 24 may generate and output the status information STinfo corresponding to various states depending on the count value VALc.

The central processing unit 25 may update the status of the memory block depending on the status information STinfo, and may manage the memory block based on the updated status. For example, the central processing unit 25 may output the control signal CONS based on the status information STinfo during a subsequent operation on the memory block corresponding to the status information STinfo. The control signal CONS may be transmitted to the command generator 21, and the command generator 21 may generate a command for a subsequent operation in response to the control signal CONS.

Figure 3:
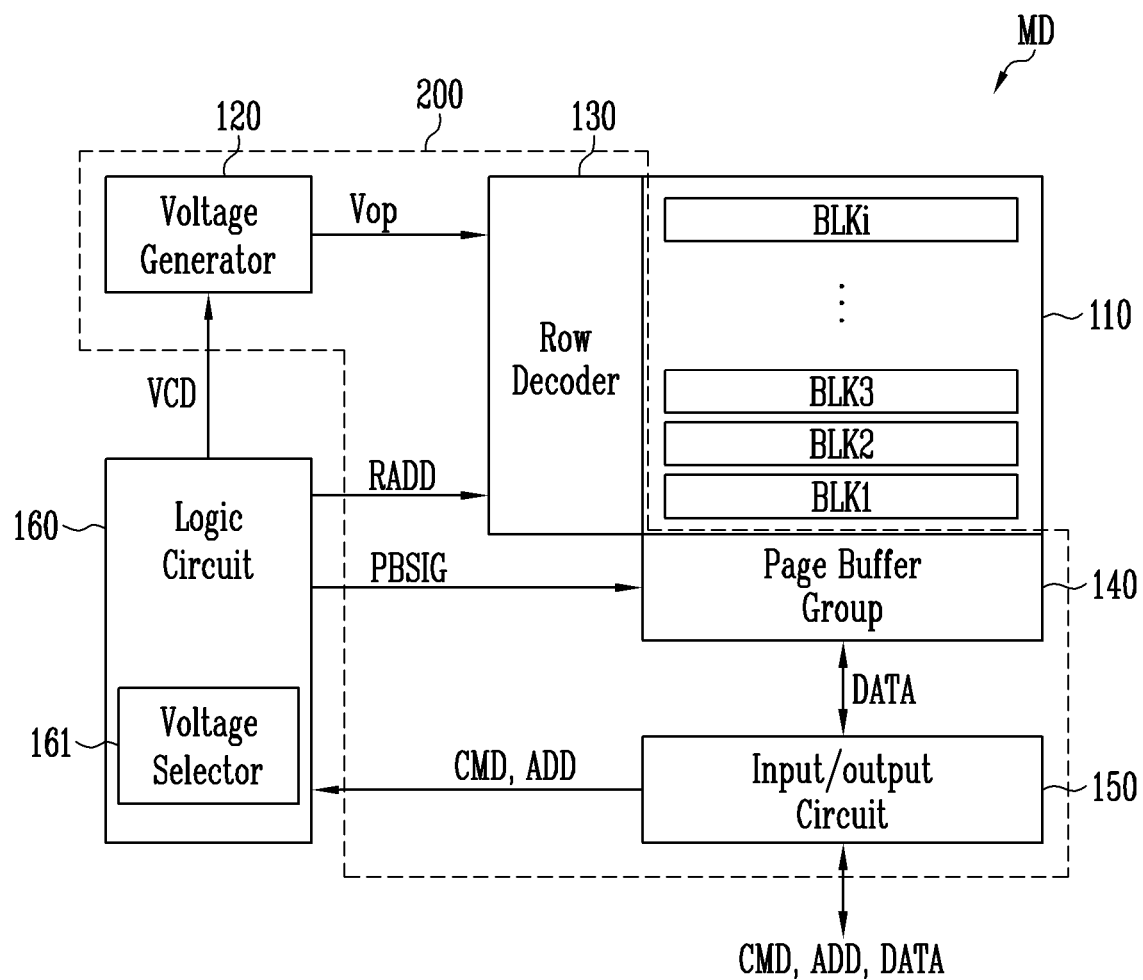
FIG. 3 is a diagram illustrating a memory device according to an embodiment of the present disclosure.

FIG. 3 is a diagram illustrating a memory device MD according to an embodiment of the present disclosure.

Referring to FIG. 3, a memory device MD may include a memory cell array 110 which stores data, a peripheral circuit 200 which performs a program operation, a read operation or an erase operation, and a logic circuit 160 which controls the peripheral circuit 200.

The memory cell array 110 may include a plurality of memory blocks BLK1 to BLKi in which data is stored. Each of the memory blocks BLK1 to BLKi may include a plurality of memory cells, which may be implemented in a two-dimensional (2D) structure in which memory cells are horizontally arranged on a substrate, or in a three-dimensional (3D) structure in which memory cells are vertically stacked on a substrate.

The peripheral circuit 200 may include a voltage generator 120, a row decoder 130, a page buffer group 140, and an input/output circuit 150. The voltage generator 120 may generate and output operating voltages Vop for various operations in response to voltage code VCD. For example, the voltage generator 120 may generate and output a program voltage, a verify voltage, a read voltage, a pass voltage, an erase voltage, etc. having various levels.

The row decoder 130 may select one memory block from among the memory blocks BLK1 to BLKi included in the memory cell array 110 in response to a row address RADD, and may transmit operating voltages Vop to the selected memory block.

The page buffer group 140 may be coupled to the memory cell array 110 through bit lines. For example, the page buffer group 140 may include page buffers coupled to respective bit lines. The page buffers may be simultaneously operated in response to page buffer control signals PBSIG, and may temporarily store data during a program or read operation.

During a check operation according to the present embodiment, the page buffer group 140 may store data sensed from a selected page in the selected memory block or may flip the sensed data and store the flipped data, in response to the page buffer control signals PBSIG. Here, the flipped data denotes inverted data of the sensed data.

The input/output circuit 150 may be coupled to a memory controller (e.g., a memory controller 1200 of FIG. 1) through the input/output lines. The input/output circuit 150 may receive/output a command CMD, an address ADD, and data DATA through the input/output lines. For example, the input/output circuit 150 may transmit the command CMD and the address ADD received through the input/output lines to the logic circuit 160, and may transmit the data DATA, received through the input/output lines to the page buffer group 140. The input/output circuit 150 may output the data DATA, received from the page buffer group 140, to the memory controller 1200 through the input/output lines.

The logic circuit 160 may output the voltage code VCD, the row address RADD, the page buffer control signals PBSIG, and a column address CADD in response to the command CMD and the address ADD. For example, the logic circuit 160 may include software which executes an algorithm in response to the command CMD, and hardware which outputs various signals depending on the address ADD and the algorithm.

The logic circuit 160 according to the present embodiment may control the peripheral circuit 200 so that the status of selection transistors included in the memory blocks BLK1 to BLKi is checked in response to the command CMD. When the command CMD for a read operation is received, the logic circuit 160 may select a read voltage corresponding to the command CMD, and may output voltage code VCD for generating the selected read voltage. For example, the logic circuit 160 may include a voltage selector 161 for outputting the voltage code VCD corresponding to the read voltage in response to the command CMD. The voltage selector 161 may select a single read voltage or a plurality of read voltages to be used in a read operation in response to the command CMD.

Figure 4:
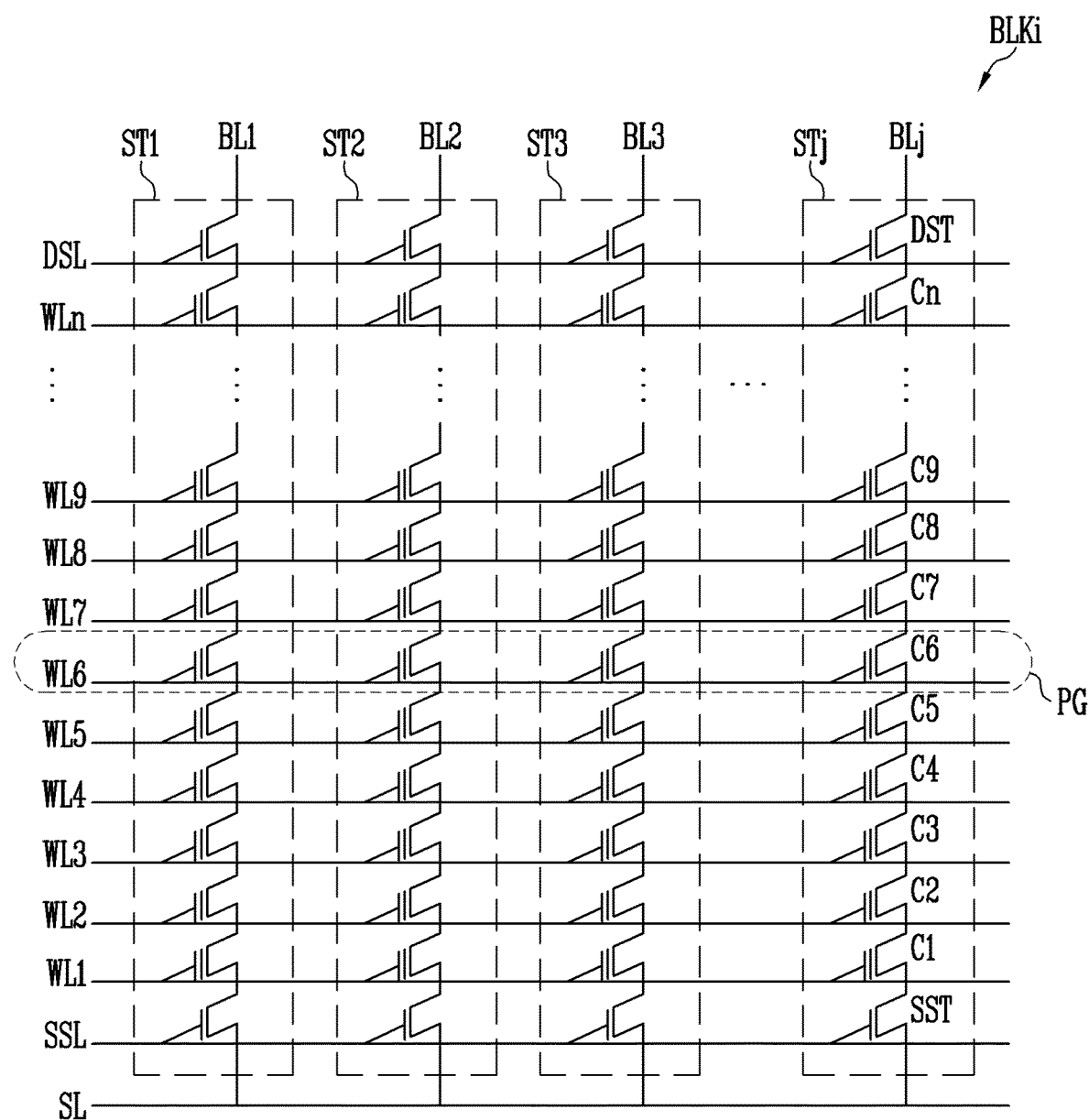
FIG. 4 is a diagram illustrating a memory block of FIG. 3.

FIG. 4 is a diagram illustrating the memory block of FIG. 3, wherein the i-th memory block BLKi, among the plurality of memory blocks BLK1 to BLKi illustrated in FIG. 3, is illustrated as an example.

Referring to FIG. 4, the i-th memory block BLKi may include a plurality of strings ST1 to STj (where j is a positive integer). The first to j-th strings ST1 to STj may be coupled between bit lines BL1 to BLj and a source line SL. For example, the first string ST1 may be coupled between the first bit line BL1 and the source line SL, the second string ST2 may be coupled between the second bit line BL2 and the source line SL, and the j-th string STj may be coupled between the j-th bit line BLj and the source line SL.

Each of the first to j-th strings ST1 to STj may include a source selection transistor SST, a plurality of memory cells C1 to Cn, and a drain selection transistor DST, and may further include dummy cells between the memory cells C1 to Cn and the source or drain selection transistor SST or DST although not illustrated in the drawing. The configuration of the j-th string STj is described in detail below by way of example.

The source selection transistor SST included in the j-th string STj may electrically couple or decouple the source line SL and the first memory cell C1 to or from each other depending on the voltage applied to a source selection line SSL. Gates of the first to n-th memory cells C1 to Cn may be coupled to first to n-th word lines WL1 to WLn, respectively. The drain selection transistor DST may electrically couple or decouple the j-th bit line BLj and the n-th memory cell Cn to or from each other depending on the voltage applied to a drain selection line DSL. Gates of the source selection transistors SST included in different strings ST1 to STj may be coupled in common to the source selection line SSL, gates of the first to n-th memory cells C1 to Cn may be coupled to the first to n-th word lines WL1 to WLn, and gates of the drain selection transistors DST may be coupled in common to the drain selection line DSL. A group of memory cells coupled to the same word line may be referred to as a page (PG), and a program operation and a read operation may be performed on a page (PG) basis.

The program operation according to the present embodiment may be performed in an incremental step pulse programming (ISPP) manner in which a program voltage is increased in steps. During a program operation performed in the ISPP manner, a plurality of program loops may be performed until the threshold voltages of selected memory cells are increased to target voltages, and the program voltage may be increased in steps whenever each program loop is performed.

The first to n-th memory cells C1 to Cn may program or read data using various schemes depending on the number of bits stored. For example, in a single-level cell scheme, one bit of data may be stored and read in and from one memory cell, and in a multi-level cell scheme, two bits of data may be stored and read in and from one memory cell.

In the single-level cell scheme, one bit of data is stored in each memory cell, and thus data stored in the memory cell may be 0 or 1. That is, each of memory cells programmed in the single-level cell scheme may be in one erased state or in one program state. Therefore, during a read operation based on a single-level cell scheme, one read voltage may be used to distinguish threshold voltage distributions in one erased state and in one program state from each other.

In the multi-level cell scheme, two bits of data are stored in each memory cell, and thus data stored in the memory cell may be 00, 01, 10 or 11. That is, each of memory cells programmed in the multi-level cell scheme may be in one erased state or in one of three program states. Therefore, during a read operation based on a multi-level cell scheme, three read voltages may be used to distinguish threshold voltage distributions in one erased state and in three program states from each other.

Based on various schemes, such as a triple-level cell scheme of storing three bits of data in one memory cell and a quadruple-level cell scheme of storing four bits of data in one memory cell, in addition to the multi-level cell scheme, a program operation or a read operation may be performed.

The logic circuit 160 according to the present embodiment may be configured to program, according to a single-level cell scheme, the selection transistors included in an erased memory block. The logic circuit 160 may be configured to read, according to a multi-level cell scheme or a triple-level cell scheme, the programmed selection transistors, which is programmed according to the single-level cell scheme, so as to check the selection transistors. The logic circuit 160 may be configured to perform a read operation using various schemes, such as a quadruple-level cell or a higher-level cell scheme other than the single-level cell scheme.

Figure 5:
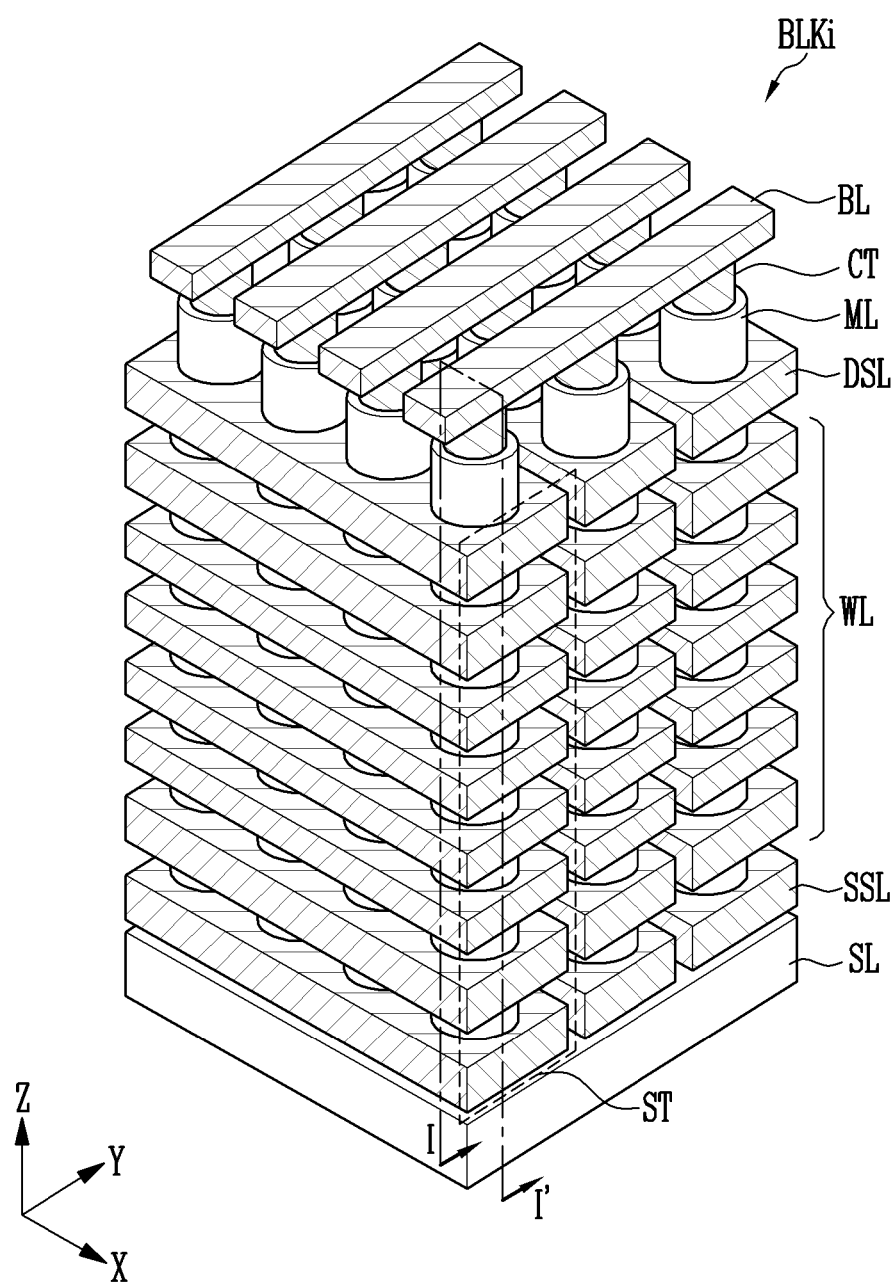
FIG. 5 is a perspective view illustrating the memory block of FIG. 4.

FIG. 5 is a perspective view illustrating the memory block of FIG. 4. Referring to FIGS. 5 and 4, the i-th memory block BLKi according to the present embodiment may be implemented in a three-dimensional (3D) structure. When a source line SL is horizontally formed on the top of a substrate, strings ST1 to ST4 may be formed in a vertical direction (e.g., a Z direction) on the top of the source line SL. For example, a source selection line SSL, word lines WL, and a drain selection line DSL may be sequentially stacked on the source line SL. The number of source selection lines SSL, the number of word lines WL and the number of drain selection lines DSL are not limited to those shown in the drawing, and may change depending on the memory device.

Each of the strings ST1 to ST4 may include a memory layer ML vertically penetrating the source selection line SSL, the word lines WL, and the drain selection line DSL. The memory layer ML may include a charge trap layer that is capable of trapping electrons. A contact CT may be formed on the top of the memory layer ML, and a bit line BL may be formed on the top of the contact CT. In order to describe in detail any one of the strings ST1 to ST4, section I-I' will be described below.

Figure 6:
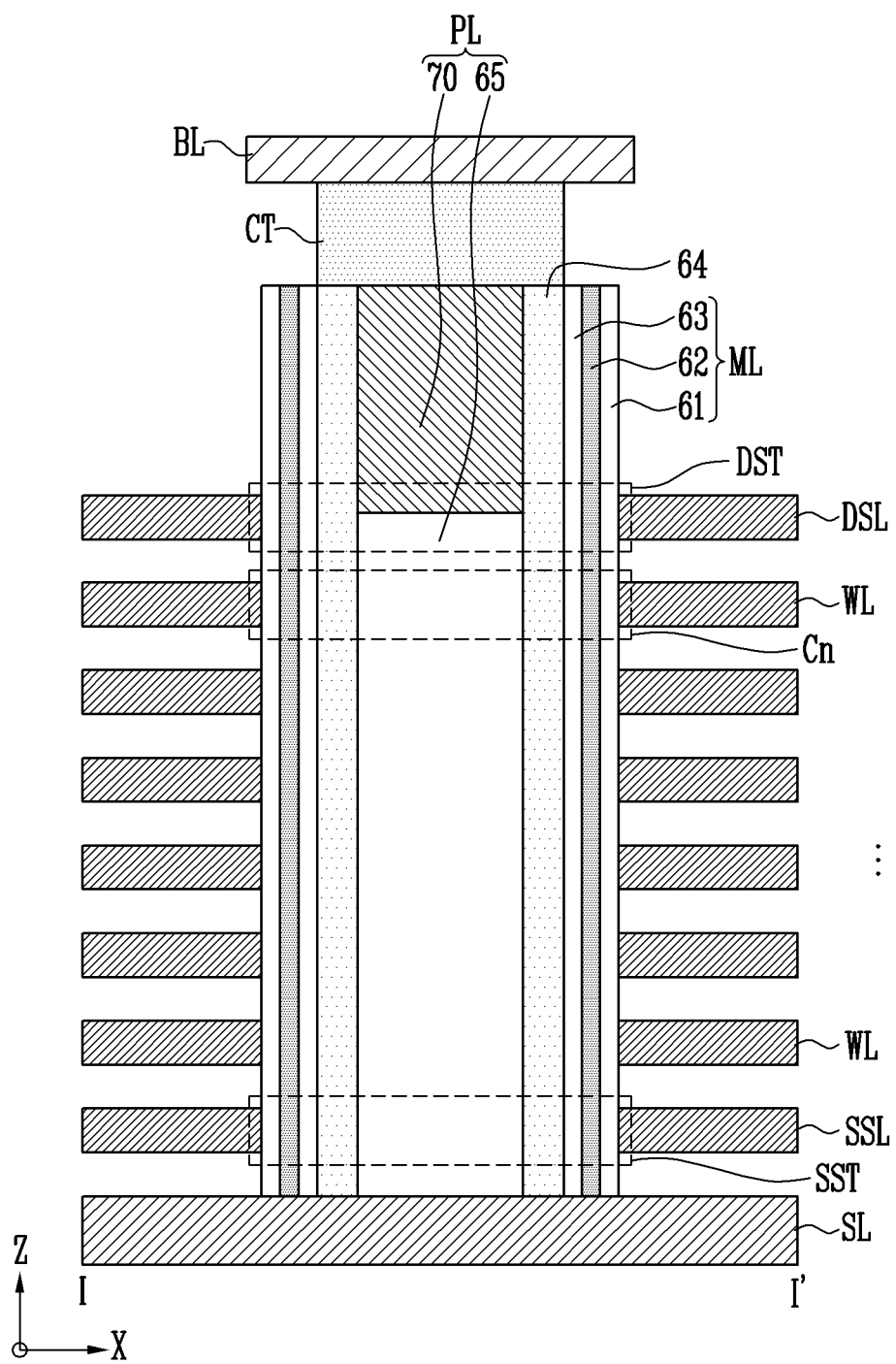
FIG. 6 is a view illustrating the section of the memory block of FIG. 5.

FIG. 6 is a view illustrating an example of the section I-I' of the memory block of FIG. 5, which section may correspond to or be representative of any one string.

Referring to FIG. 6, the source selection line SSL, the word lines WL, and the drain selection line DSL may be sequentially stacked on the top of the source line SL. The memory layer ML may be formed to vertically penetrate (e.g., in a Z direction) the drain selection line DSL, the word lines WL, and the source selection line SSL.

In accordance with one embodiment, the memory layer ML may be formed in a predetermined (e.g., cylindrical) shape, and may sequentially include a blocking layer 61 a charge trap layer 62, and a tunnel isolation layer 63 in a direction from an outer circumference to an inner circumference. The blocking layer 61 may be formed of an insulating layer, for example, an oxide layer. The charge trap layer 62 may be a layer for storing data, and may be formed of a nitride layer. For example, electrons having negative charges may be stored in the charge trap layer 62 using a program voltage during a program operation, and the electrons stored in the charge trap layer 62 may be discharged to the outside using an erase voltage during an erase operation. The tunnel isolation layer 63 may be formed of an insulating layer, for example, an oxide layer.

A channel layer 64 may be formed on an inner circumferential surface of the cylindrical memory layer ML. The channel layer 64 may have a predetermined shape (e.g., cylindrical), may be a layer in which charges can move, and may be formed of, for example, an undoped semiconductor layer. In an embodiment, the undoped semiconductor layer may include an undoped silicon layer.

A plug PL may be formed inside the cylindrical channel layer 64 and may have a predetermined shape, e.g., cylindrical. For example, the plug PL may include a vertical isolation layer 65 and a capping layer 70. Both the vertical isolation layer 65 and the capping layer 70 may be formed in a cylindrical shape, and the capping layer 70 may be formed on the top of the vertical isolation layer 65. The vertical isolation layer 65 may be formed of an insulating layer, for example, an oxide layer. The capping layer 70 may be formed of a doped silicon layer that is doped with impurities.

A contact CT may be formed on the top of the memory layer ML, the channel layer 64 and the plug PL, and a bit line BL may be formed on the top of the contact CT. The contact CT may be a layer for electrically coupling the bit line BL to the channel layer 64 and may be formed of a conductive layer.

In a memory block having a 3D structure, the source selection transistor SST, the memory cells Cn, and the drain selection transistor DST may be formed in a similar structure. For example, similar to the memory cells Cn, each of the source selection transistor SST and the drain selection transistor DST may include the charge trap layer 62. Accordingly, in order for the source selection transistor SST and the drain selection transistor DST to perform a switching function, the source selection transistor SST and the drain selection transistor DST may be programmed to have threshold voltages at a predetermined level. For example, after an erase operation has been performed on the memory block, a program operation of increasing the threshold voltages of the source selection transistor SST and the drain selection transistor DST may be performed. For example, the program operation of increasing the threshold voltages of the source selection transistor SST and the drain selection transistor DST may be performed as a background operation rather than as an operation responding to a user request.

Since the source selection transistor SST and the drain selection transistor DST are included in all strings included in the memory block, threshold voltage distributions of the source selection transistor SST and the drain selection transistor DST are formed within a predetermined level range when the program operation of increasing the threshold voltages of the source selection transistor SST and the drain selection transistor DST is performed. Therefore, there may be a difference between the threshold voltages of drain selection transistors DST or source selection transistors SST coupled to the same drain selection line DSL or the same source selection line SSL.

In order for the source selection transistors SST and the drain selection transistors DST to operate normally, the threshold voltage distributions of each of the source selection transistors SST and the drain selection transistors DST should fall within a range between a turn-on voltage and a turn-off voltage applied to gates of the source selection transistors SST and the drain selection transistors DST. For example, the threshold voltages of the source selection transistors SST and the drain selection transistors DST should be lower than the turn-on voltage and higher than the turn-off voltage. Therefore, when source selection transistors SST or drain selection transistors DST having threshold voltages lower than the turn-off voltage or threshold voltages higher than the turn-on voltage are included in the memory block, a normal operation cannot be performed on the corresponding memory block. Accordingly, the present embodiment discloses technology for quickly checking source selection transistors SST and drain selection transistors DST having threshold voltages falling out of a normal or a desired range from a first read voltage to a second read voltage.

Figure 7:
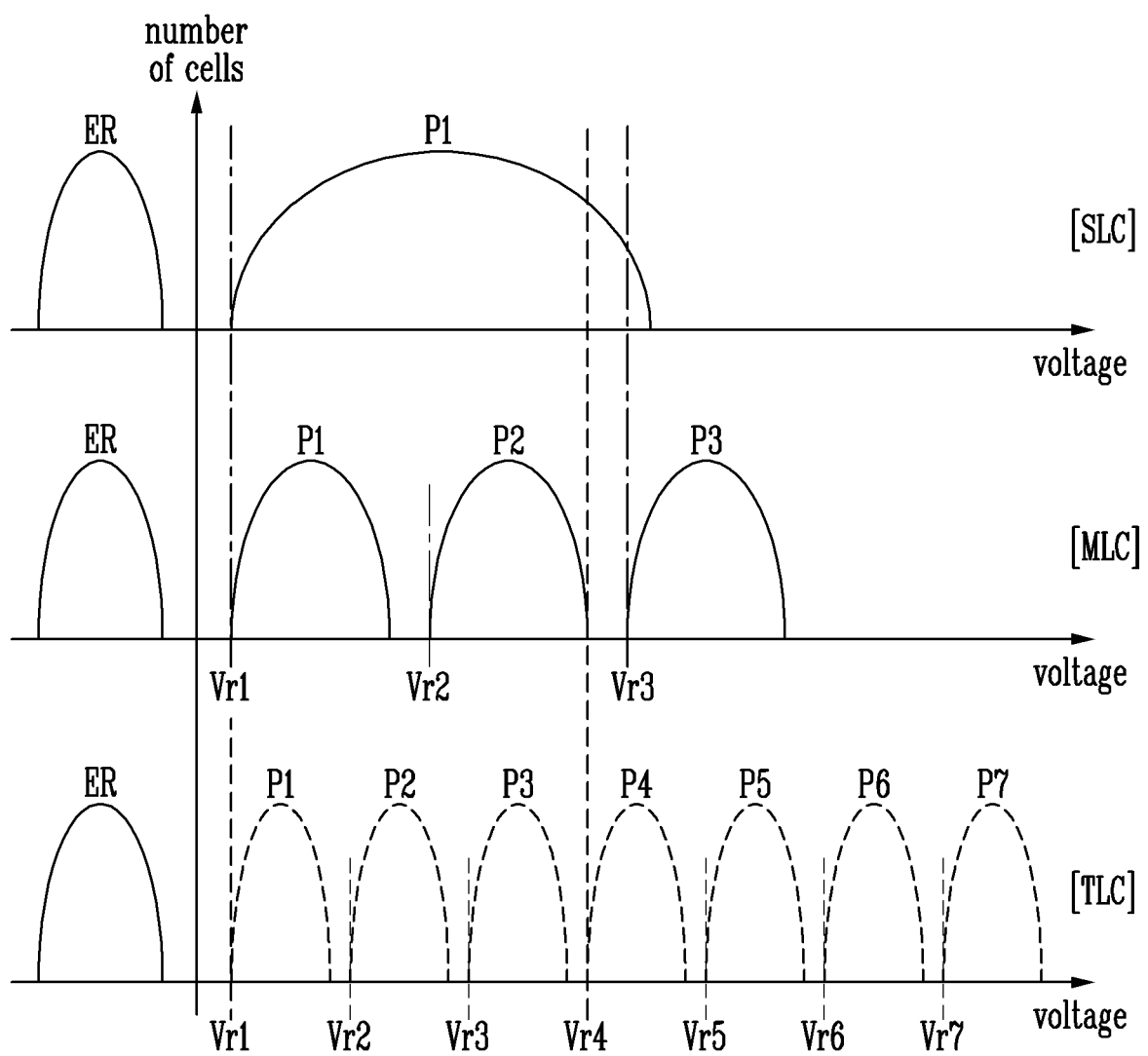
FIG. 7 is a diagram for explaining read voltages used in a check operation according to an embodiment of the present disclosure.

FIG. 7 is a diagram for explaining read voltages used in a check operation according to an embodiment of the present disclosure.

Referring to FIG. 7, in a single-level cell (SLC) scheme, memory cells may be programmed only to a first program state P1 and thus a first read voltage Vr1 may be used in a read operation.

In a multi-level cell (MLC) scheme, memory cells may be programmed to first to third program states P1 to P3, and thus first to third read voltages Vr1 to Vr3 may be used in a read operation. For example, the first read voltage Vr1 used in the multi-level cell (MLC) scheme may be a voltage for distinguishing memory cells in an erased state ER from memory cells in the first to third program states P1 to P3. The second read voltage Vr2 may be a voltage for distinguishing memory cells in the erased state ER and the first program state P1 from memory cells in the second and third program states P2 and P3. The third read voltage Vr3 may be a voltage for distinguishing memory cells in the erased state ER and the first and second program states P1 and P2 from memory cells in the third program state P3.

In a triple-level cell (TLC) scheme, memory cells may be programmed to first to seventh program states P1 to P7 and thus first to seventh read voltages Vr1 to Vr7 may be used in a read operation. For example, the first read voltage Vr1 used in the triple-level cell (TLC) scheme may be a voltage for distinguishing memory cells in an erased state ER from memory cells in the first to seventh program states P1 to P7. The second read voltage Vr2 may be a voltage for distinguishing memory cells in the erased state ER and the first program state P1 from memory cells in the second to seventh program states P2 to P7. The third read voltage Vr3 may be a voltage for distinguishing memory cells in the erased state ER and the first and second program states P1 and P2 from memory cells in the third to seventh program states P3 to P7. The fourth read voltage Vr4 may be a voltage for distinguishing memory cells in the erased state ER and the first to third program states P1 to P3 from memory cells in the fourth to seventh program states P4 to P7. The fifth read voltage Vr5 may be a voltage for distinguishing memory cells in the erased state ER and the first to fourth program states P1 to P4 from memory cells in the fifth to seventh program states P5 to P7. The sixth read voltage Vr6 may be a voltage for distinguishing memory cells in the erased state ER and the first to fifth program states P1 to P5 from memory cells in the sixth and seventh program states P6 and P7. The seventh read voltage Vr7 may be a voltage for distinguishing memory cells in the erased state ER and the first to sixth program states P1 to P6 from memory cells in seventh program state P7.

In the present embodiment, the selection transistors may be programmed using a single-level cell (SLC) scheme and may be read using a higher level cell scheme than the single-level cell (SLC) scheme during a check operation. For example, the selection transistors, which is programmed according to a single-level cell (SLC) scheme, may be read using a multi-level cell (MLC) or a triple-level cell (TLC) scheme. In particular, during a check operation of checking the states of the threshold voltages of the selection transistors, which are programmed according to a single-level cell (SLC) scheme, two read voltages may be successively used according to a multi-level cell (MLC) or a triple-level cell (TLC) scheme so as to quickly check low threshold voltages and high threshold voltages of the selection transistors. Here, the selection transistors having low threshold voltages may be slow transistors, the threshold voltages of which increase slower than a normal time, and the selection transistors having high threshold voltages may be fast transistors, the threshold voltages of which increase faster than a normal time.

In the case of a read operation based on a multi-level cell (MLC) scheme as an example, in response to a read command, a read operation using the second read voltage Vr2 may be performed, and a read operation using the first and third read voltages Vr1 and Vr3 may be performed. During a read operation using the second read voltage Vr2, all of memory cells in the erased state ER and the first program state P1 may be read as memory cells in the erased state with respect to the second read voltage Vr2, and all of the memory cell in the second and third program states P2 and P3 may be read as memory cells in a program state. During read operations using the first and third read voltages Vr1 and Vr3, the read operation using the third read voltage Vr3 may be performed after the read operation using the first read voltage Vr1 has been performed. In contrast, the read operation using the first read voltage Vr1 may be performed after the read operation using the third read voltage Vr3 has been performed. In the present embodiment, a read operation of checking whether slow transistors and fast transistors are included in selection transistors is performed, and thus a read operation of successively using at least two read voltages may be performed.

In the present embodiment, during a check operation of checking the states of the threshold voltages of the selection transistors, which are programmed according to a single-level cell (SLC) scheme, the first and third read voltages Vr1 and Vr3 may be successively used when the read operation is performed according to a multi-level cell (MLC) scheme so as to quickly check low threshold voltages and high threshold voltages of the selection transistors.

Even in the case of a read operation based on a triple-level cell (TLC) scheme, a read operation of successively using at least two read voltages may be performed. For example, a read operation of successively using the first and fourth read voltages Vr1 and Vr4 may be performed. In the present embodiment, during a check operation of checking the states of the threshold voltages of the selection transistors, which are programmed according to a single-level cell (SLC) scheme, these first and fourth read voltages Vr1 and Vr4 may be successively used when the read operation is performed according to a triple-level cell (TLC) scheme so as to quickly check low threshold voltages and high threshold voltages of the selection transistors.

In the present embodiment, the check operation may be performed as a read operation based on a multi-level cell (MLC) or triple-level cell (TLC) scheme or may be performed as a read operation based on a quadruple-level cell (QLC) scheme or the like. The scheme of the read operation and read voltages for the check operation may be differently selected depending on the threshold voltage distributions of selection transistors to be programmed.

In the present embodiment, the read voltages may be selected by the voltage selector 161 included in the logic circuit 160 in response to the command CMD provided from the memory controller 1200.

Figure 8:
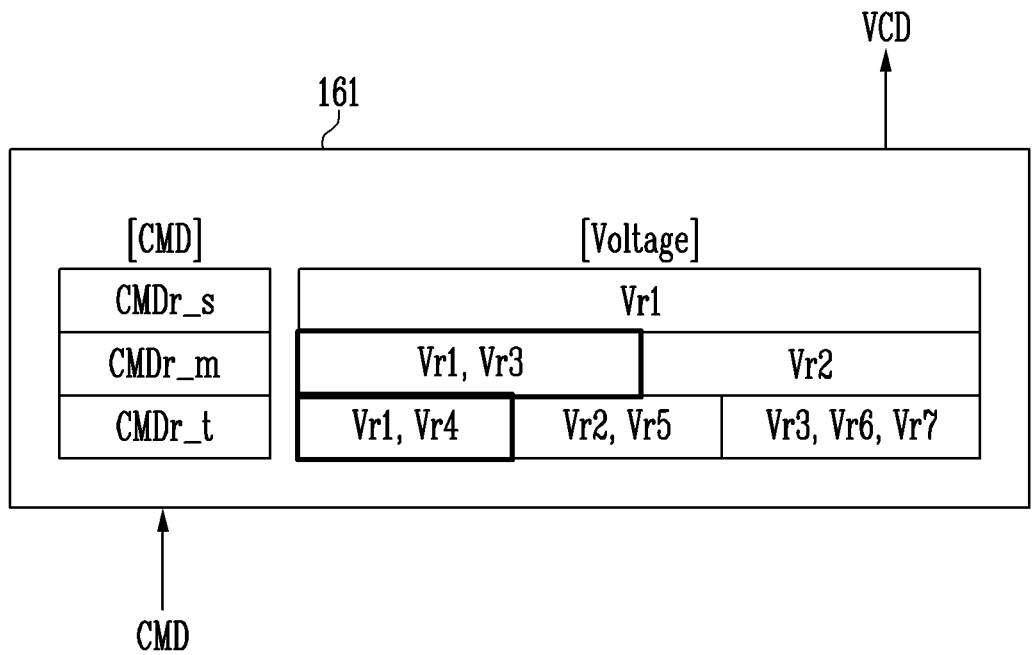
FIG. 8 is a diagram illustrating a voltage selector according to an embodiment of the present disclosure.

FIG. 8 is a diagram illustrating a voltage selector according to an embodiment of the present disclosure.

Referring to FIG. 8, a voltage selector 161 may output read voltages in response to a command CMD. The voltage selector 161 may select read voltages to be used in a check operation depending on the type of the command CMD, and may output voltage code VCD for generating the selected read voltages. For example, when a read command CMDr_S based on a single-level cell (SLC) scheme is received, the voltage selector 161 may output voltage code VCD for generating a first read voltage Vr1. When a read command CMDr_m based on a multi-level cell (MLC) scheme is received, the voltage selector 161 may output voltage code VCD for generating first and third read voltages Vr1 and Vr3 and voltage code VCD for generating a second read voltage Vr2. When a read command CMDr_t based on a triple-level cell (TLC) scheme is received, the voltage selector 161 may output voltage code VCD for generating first and fourth read voltages Vr1 and Vr4, voltage code VCD for generating second and fifth read voltages Vr2 and Vr5, and voltage code VCD for generating third, sixth, and seventh read voltages Vr3, Vr6, and Vr7.

During the check operation according to the present embodiment, when the read command CMDr_m based on the multi-level cell (MLC) scheme is received, the voltage selector 161 may output the voltage code VCD for generating the first and third read voltages Vr1 and Vr3 and the voltage code VCD for generating the second read voltage Vr2, When the read command CMDr_t based on the triple-level cell (TLC) scheme is received, the voltage selector 161 may output the voltage code VCD for generating the first and fourth read voltages Vr1 and Vr4, the voltage code VCD for generating the second and fifth read voltages Vr2 and Vr5, and the voltage code VCD for generating third, sixth, and seventh read voltages Vr3, Vr6, and Vr7.

Figure 9:
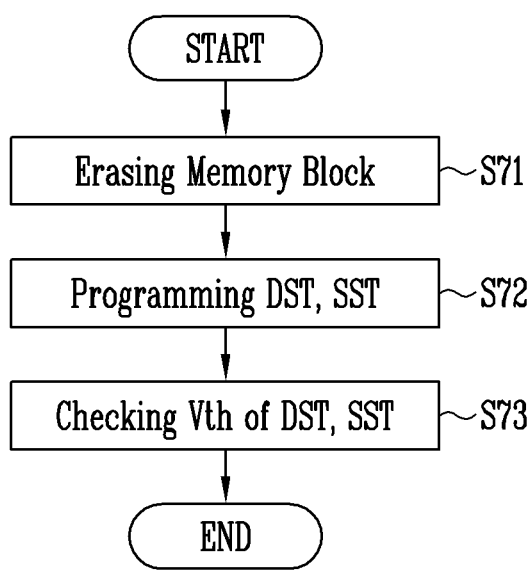
FIG. 9 is a diagram illustrating the operation of a memory system according to an embodiment of the present disclosure.

FIG. 9 is a diagram illustrating the operation of a memory system according to an embodiment of the present disclosure.

Referring to FIG. 9, when an erase operation that is performed on a memory block selected from memory blocks included in a memory device is completed at step S71, the memory system may perform a program operation of increasing the threshold voltages of selection transistors DST and SST included in the selected memory block at step S72. The program operation on the selection transistors DST and SST may be performed using a single-level cell (SLC) scheme.

After the program operation performed on the selection transistors DST and SST has been completed, the memory system may perform a check operation of checking the threshold voltages Vth of the selection transistors DST and SST at step S73. The check operation may be performed as a read operation based on a multi-level cell (MLC) scheme or a higher level cell scheme. The memory system may check the status of the selection transistors based on the data read from the selection transistors during the read operation and may determine whether the selected memory block including the selection transistors is a bad block or a normal block.

The memory system may store the status information of the selected memory block generated during the check operation and may exploit the status information during a subsequent operation to be performed on the selected memory block. Examples of the threshold voltages of the selection transistors will be described in detail below.

Figure 10:
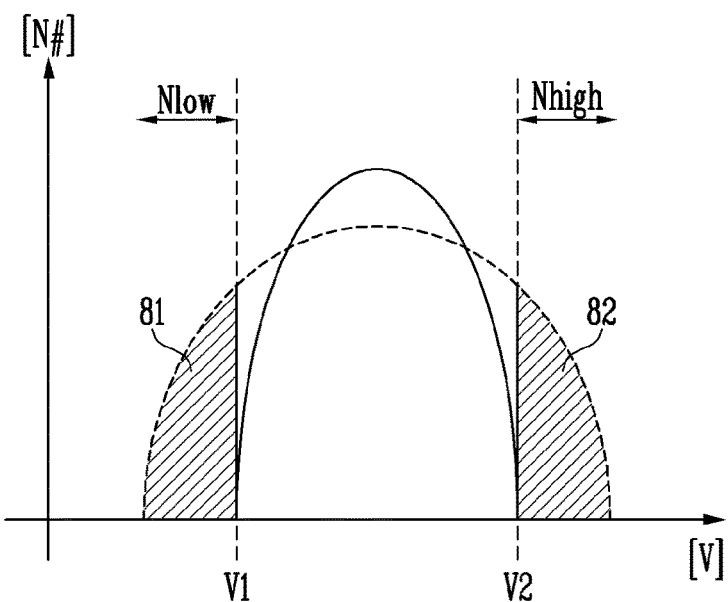
FIG. 10 is a diagram for explaining threshold voltage distributions of selection transistors.

FIG. 10 is a diagram for explaining threshold voltage distributions of selection transistors.

Referring to FIG. 10, it is assumed that the threshold voltages of normal selection transistors are distributed in a range from the first read voltage V1 to the second read voltage V2. The first read voltage V1 may be lower than the second read voltage V2. In the present embodiment, the first and third read voltages Vr1 and Vr3 illustrated in FIG. 7 may be respectively the first and second read voltages V1 and V2 when the read operation is performed according to a multi-level cell (MLC) scheme for the check operation. In the present embodiment, the first and fourth read voltages Vr1 and Vr7 illustrated in FIG. 7 may be respectively the first and second read voltages V1 and V2 when the read operation is performed according to a triple-level cell (TLC) scheme for the check operation.

When the threshold voltages of the selection transistors fall within a range Nlow lower than the first read voltage V1 (81), the turn-on levels of the selection transistors are lower than a reference level, thus generating a leakage current. When the threshold voltages of the selection transistors fall within a range Nhigh higher than the second read voltage V2 (82), the turn-on levels of the selection transistors are higher than the reference level, thus causing the selection transistors to be turned off in an operation in which the selection transistors are supposed to be turned on.

The selection transistors having threshold voltages lower than the first read voltage V1 may be slow selection transistors, and the selection transistors having threshold voltages higher than the second read voltage V2 may be fast selection transistors. Since the selection transistors included in the memory block electrically couple or decouple bit lines or a source line and strings to or from each other, the reliability of the memory block may be deteriorated when slow or fast selection transistors are included in the memory block.

Accordingly, the memory system according to the present embodiment may determine whether slow or fast selection transistors are included in the memory block through a check operation and may determine the status of the memory block based on data that is read in the check operation.

Figure 11:
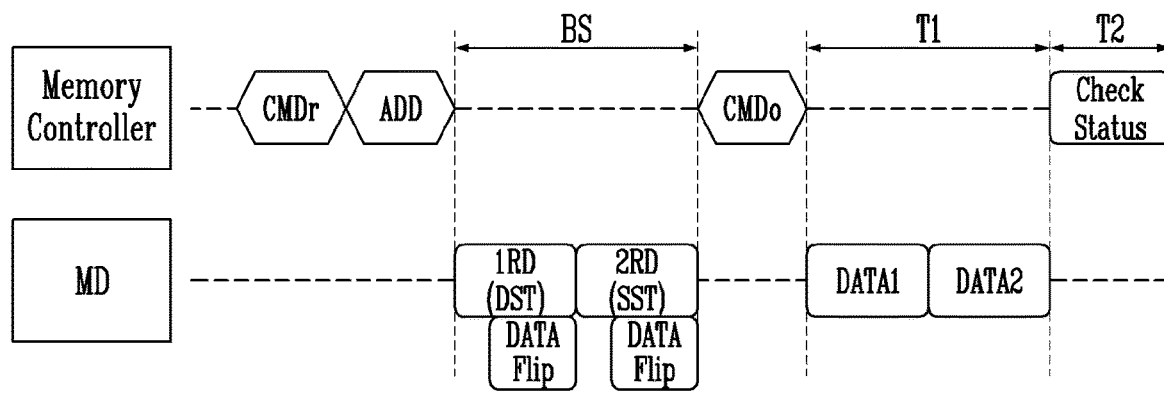
FIG. 11 is a diagram illustrating a check operation of a memory system according to an embodiment of the present disclosure.

FIG. 11 is a diagram illustrating the check operation of a memory system according to an embodiment of the present disclosure.

Referring to FIG. 11, when the check operation is initiated, a memory controller may output a read command CMDr and an address ADD to a selected memory device MD. The read command CMDr may be a read command based on a multi-level cell or triple-level cell scheme, and the address ADD may be the address of a memory block that is the target of a check operation.

The memory device MD may sequentially perform a first read operation 1RD and a second read operation 2RD in response to the read command CMDr and the address ADD. A period during which the first and second read operations 1RD and 2RD are performed may be a busy period BS during which the memory controller does not transmit other commands to the corresponding memory device. The first read operation 1RD may be an operation of checking the status of drain selection transistors, and the second read operation 2RD may be an operation of checking the status of source selection transistors.

During the first read operation, a read operation of checking low threshold voltages of the drain selection transistors and a read operation of checking high threshold voltages of the drain selection transistors may be successively performed. During the second read operation, a read operation of checking low threshold voltages of the source selection transistors and a read operation of checking high threshold voltages of the source selection transistors may be successively performed.

The memory device may quickly transmit the read data to the memory controller. The memory device may flip read data that is read in some read operations to help the memory controller to quickly check the status of the memory block. For example, the memory device may store data that is read during a read operation of checking low threshold voltages without change and may flip and then store data read during a read operation of checking high threshold voltages.

For example, when data is read in the read operation of checking high threshold voltages, the memory device may additionally perform a data flip operation (DATA Flip) for flipping the read data. The data flip operation may be performed so as to adjust items of data read from the selection transistors, which have threshold voltages lower than or higher than a normal range, to have the same value. For example, assuming that a fail bit for selection transistors having threshold voltages lower than the normal range is of a value '1', the data flip operation may be performed so as to adjust items of data of the selection transistors having threshold voltages higher than the normal range to have the same value '1'. In the present embodiment, although a description is made on the assumption that the fail bit for selection transistors having threshold voltages falling out of the normal range is '1', the fail bit may be set to '0' according to the memory system.

The data flip operation may be performed in a read operation of checking high threshold voltages during the first read operation 1RD, and may also be performed in a read operation of checking high threshold voltages during the second read operation 2RD.

When the busy period BS is terminated, the memory controller may output an output command CMDo to the memory device MD. The memory device may output first data DATA1, which is the result of the first read operation 1RD, and second data DATA2, which is the result of the second read operation 2RD, to the memory controller in response to the output command CMDo. Since the first data DATA1 includes fail bits for selection transistors having threshold voltages lower than the reference voltage and threshold voltages higher than the reference voltage, the memory device may output the first data DATA1 to the memory controller. This operation may be performed without distinguishing data (which is read to check threshold voltages lower than the reference voltage) from data (which is read to check threshold voltages higher than the reference voltage). The memory device MD may transmit the first data DATA1 and successively output the second data DATA2 to the memory controller.

In this way, the read operation of checking low threshold voltages and the read operation of checking high threshold voltages are separately performed, but items of data that are read in respective read operations are included in the first or second data DATA1 or DATA2. Thus, a first time T1 for the output operation may be shortened.

When all of the first data DATA1 and the second data DATA2 are output, the memory controller may count the number of fail bits included in the first and second data DATA1 and DATA2 and may determine the status of the memory block based on a count result. In the present embodiment, assuming that the time during which the memory controller counts the number of fail bits is a second time T2, the fail bits are '1' between bit '0' and bit '1' included in the first and second data DATA1 and DATA2, and are equal to each other, thus shortening the second time T2, compared to the case where fail bits include both '0' and '1'.

That is, in accordance with the present embodiment, the first time T1 during which the memory device MD outputs the first and second data DATA1 and DATA2 to the memory controller and the second time T2 during which the memory controller counts the number of fail bits in the first and second data DATA1 and DATA2 and checks the status of the memory block may be shortened.

Figure 12:
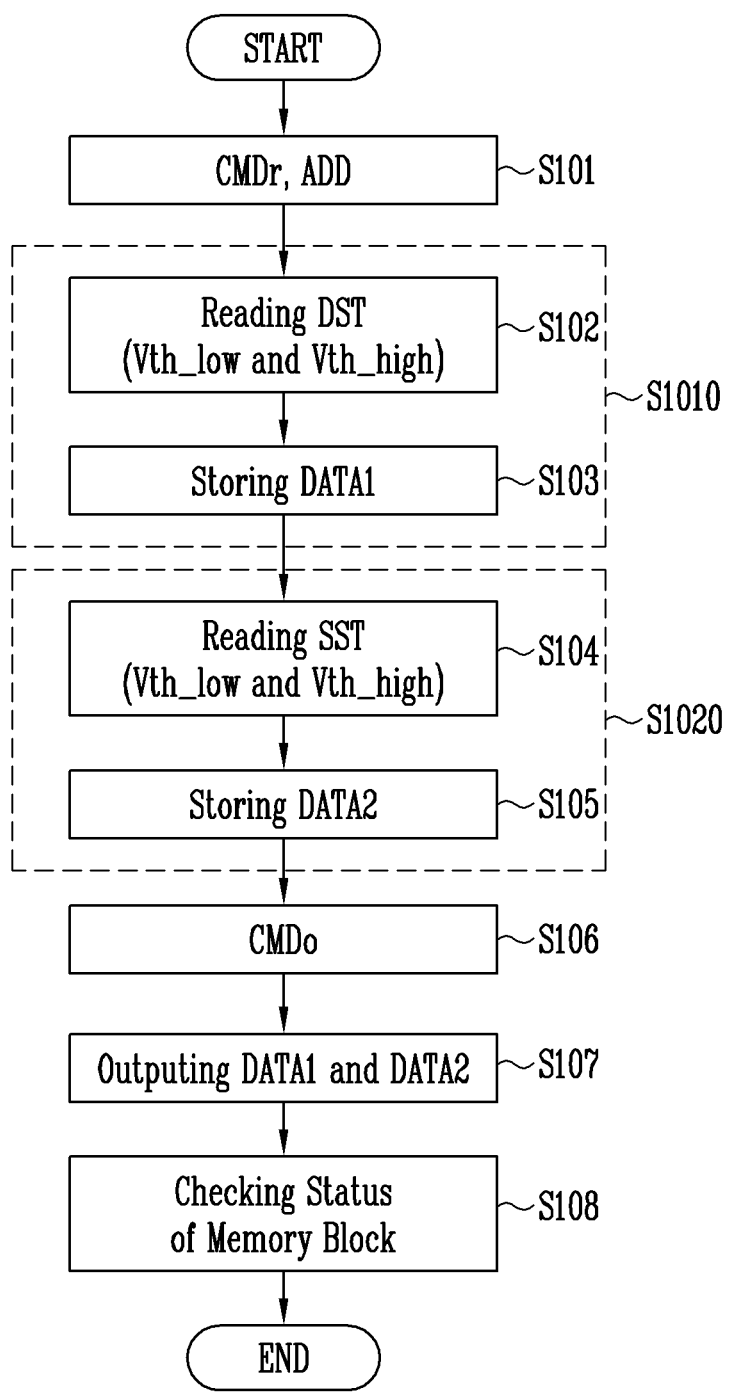
FIG. 12 is a flowchart illustrating in detail a check operation of a memory system according to an embodiment of the present disclosure.

FIG. 12 is a flowchart illustrating in detail a check operation of a memory system according to an embodiment of the present disclosure.

Referring to FIG. 12, at step S101, a memory controller included in the memory system may generate a read command CMDr and an address ADD, and may transmit the read command CMDr and the address ADD to a memory device.

The memory device may sequentially perform a first check operation S1010 on drain selection transistors included in a selected memory block and a second check operation S1020 on source selection transistors included in the selected memory block in response to the read command CMDr and the address ADD. An example of the first check operation S1010 performed on the drain selection transistors DST is described in detail below.

At step S102, the memory device may perform a read operation of checking low threshold voltages Vth_low and high threshold voltages Vth_high of the drain selection transistors included in the selected memory block. At step S102, the low threshold voltages Vth_low may be read using a relatively low read voltage, among a plurality of read voltages selected in response to the read command CMDr, and the high threshold voltages Vth_high may be read using a relatively high read voltage, among the read voltages.

At step S103, the memory device may temporarily store the read first data DATA1 in page buffers. At step S103, read data for the low threshold voltages Vth_low may be stored in the page buffers without change, and read data for the high threshold voltages Vth_high may be flipped and stored in the page buffers. The first data DATA1 may include the read data for the low threshold voltages Vth_low and the flipped read data for the high threshold voltages Vth_high. The second check operation S1020 performed on the source selection transistors SST will be described in detail below.

At step S104, the memory device may individually read low threshold voltages Vth_low and high threshold voltages Vth_high of the source selection transistors included in the selected memory block. At step S104, the low threshold voltages Vth_low may be read using a relatively low read voltage, among a plurality of read voltages selected in response to the read command CMDr, and the high threshold voltages Vth_high may be read using a relatively high read voltage, among the read voltages.

At step S105, the memory device may temporarily store the read second data DATA2 in the page buffers. At step S105, read data for the low threshold voltages Vth_low may be stored in the page buffers without change, and read data for the high threshold voltages Vth_high may be flipped and stored in the page buffers. The second data DATA2 may include the read data for the low threshold voltages Vth_low and the flipped read data for the high threshold voltages Vth_high.

At step S106, when the read operation performed on the drain and source selection transistors DST and SST is completed, the memory controller may transmit an output command CMDo to the memory device.

At step S107, the memory device may output the first and second data DATA1 and DATA2, stored in the page buffers, to the memory controller in response to the output command CMDo.

At step S108, the memory controller may count the number of fail bits included in the first and second data DATA1 and DATA2 and may check the status of the memory block depending on the count value. For example, when data of the value '1' is set as a fail bit, the memory controller may process the corresponding memory block as a bad block or a normal block depending on the count value for the fail bits included in the first and second data DATA1 and DATA2. For example, when the count value is greater than a reference value, the memory controller may process the corresponding memory block as a bad block, whereas when the count value is less than or equal to the reference value, the memory controller may process the memory block as a normal block. Alternatively, the memory controller may variously identify the status of the memory block depending on the count value.

Figure 13:
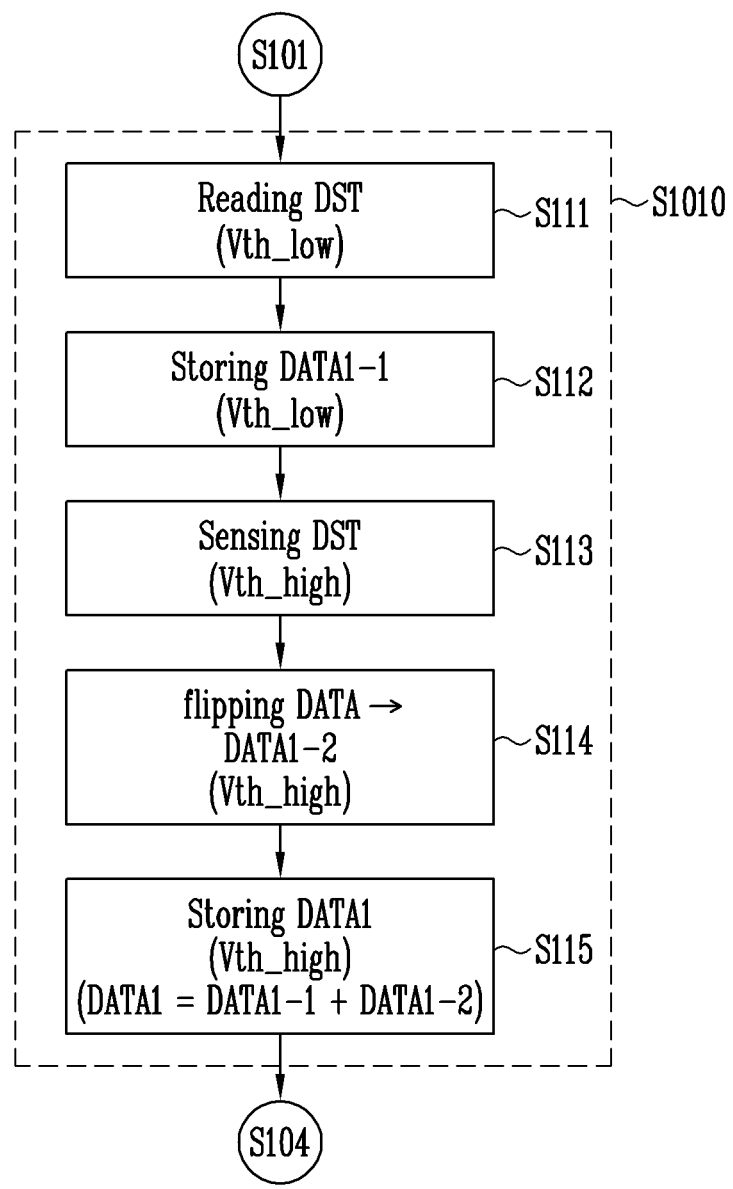
FIG. 13 is a flowchart illustrating in detail a first check operation of FIG. 12.

FIG. 13 is a flowchart illustrating in detail the first check operation of FIG. 12.

Referring to FIG. 13, the first check operation S1010 may be performed to check the threshold voltages of drain selection transistors DST included in the memory block.

At step S111, when the first check operation S1010 is initiated, the memory device may perform a read operation of checking low threshold voltages Vth_low, among the threshold voltages of the drain selection transistors DST included in the memory block. For example, when a read command is a command based on a multi-level cell (MLC) scheme, the memory device may perform the read operation on the drain selection transistors DST by performing a read operation that uses a first read voltage Vr1, as illustrated in FIG. 8. The first read voltage Vr1 may be applied to a drain selection line coupled in common to gates of the drain selection transistors.

At step S112, 1-1-th data DATA1-1 that is sensed during the read operation of checking the low threshold voltages Vth_low of the drain selection transistors DST may be temporarily stored in page buffers.

At step S113, then, the memory device may perform a read operation of checking high threshold voltages Vth_high, among the threshold voltages of the drain selection transistors DST included in the memory block. For example, when a read command is a command based on a multi-level cell (MLC) scheme, the memory device may perform the read operation on the drain selection transistors DST by performing a read operation that uses a third read voltage Vr3, as illustrated in FIG. 8. The third read voltage Vr3 may be applied to the drain selection line coupled in common to the gates of the drain selection transistors.

At step S114, data that is sensed during the read operation of checking the high threshold voltages Vth_high of the drain selection transistors DST may be temporarily stored in the page buffers, after which the temporarily stored data may be flipped in the page buffers and then be changed to 1-2-th data DATA1-2.

At step S115, in the page buffers, first data DATA1 including the 1-1-th data DATA1-1 and the 1-2-th data DATA1-2 may be stored.

Figure 14:
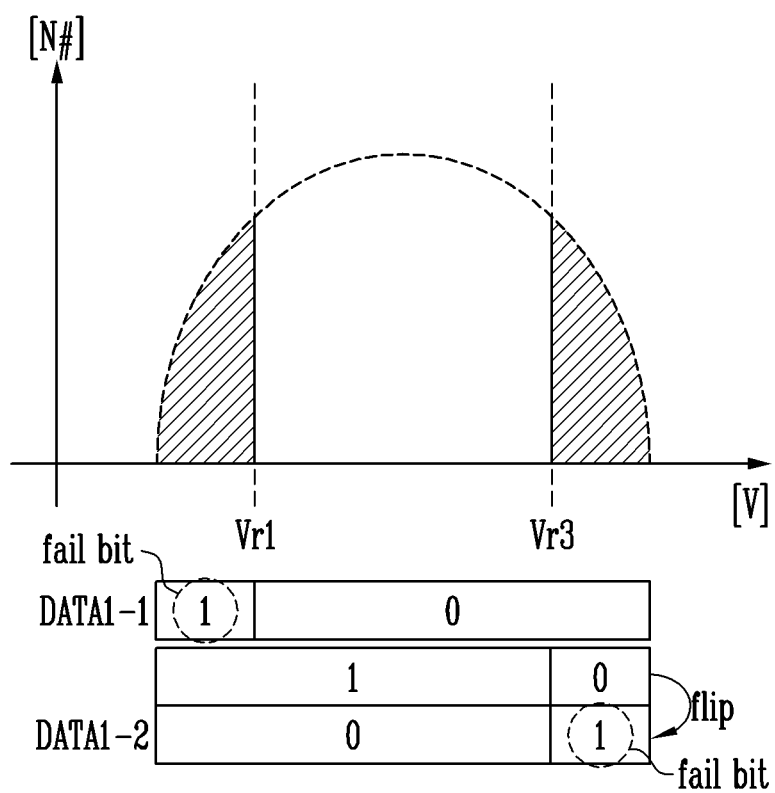
FIG. 14 is a diagram for explaining items of data that are read depending on the threshold voltages of drain selection transistors.

FIG. 14 is a diagram for explaining items of data that are read depending on the threshold voltages of drain selection transistors.

Referring to FIG. 14, when the drain selection transistors are read using a first read voltage Vr1, 1-1-th data DATA1-1 of drain selection transistors having threshold voltages lower than the first read voltage Vr1 may be sensed as '1', and 1-1-th data DATA1-1 of drain selection transistors having threshold voltages equal to or higher than the first read voltage Vr1 may be sensed as '0'. The sensed 1-1-th data DATA1-1 may be stored in the page buffers. During the read operation using the first read voltage Vr1, the drain selection transistors having threshold voltages lower than the first read voltage Vr1 are slow transistors, the program speed of which is lower than a normal speed, and thus data of the slow transistors, that is, 1, may be a fail bit.

Then, when the drain selection transistors are read using a third read voltage Vr3, data of drain selection transistors having threshold voltages lower than the third read voltage Vr3 may be sensed as '1', and data of drain selection transistors having threshold voltages equal to or higher than the third read voltage Vr3 may be sensed as '0'. When data sensed at this step is maintained without change, the drain selection transistors having threshold voltages equal to or higher than the third read voltage Vr3 are fast transistors, the program speed of which is higher than the normal speed, and thus data of the fast transistors, that is, '0', may be a fail bit. However, since '1' is a fail bit in the 1-1-th data DATA1-1, the memory device may flip data that is sensed during the read operation using the third read voltage Vr3, and may then store 1-2-th data DATA1-2 in the page buffers. Therefore, even in the 1-2-th data DATA1-2, '1' may be a fail bit.

Figure 15:
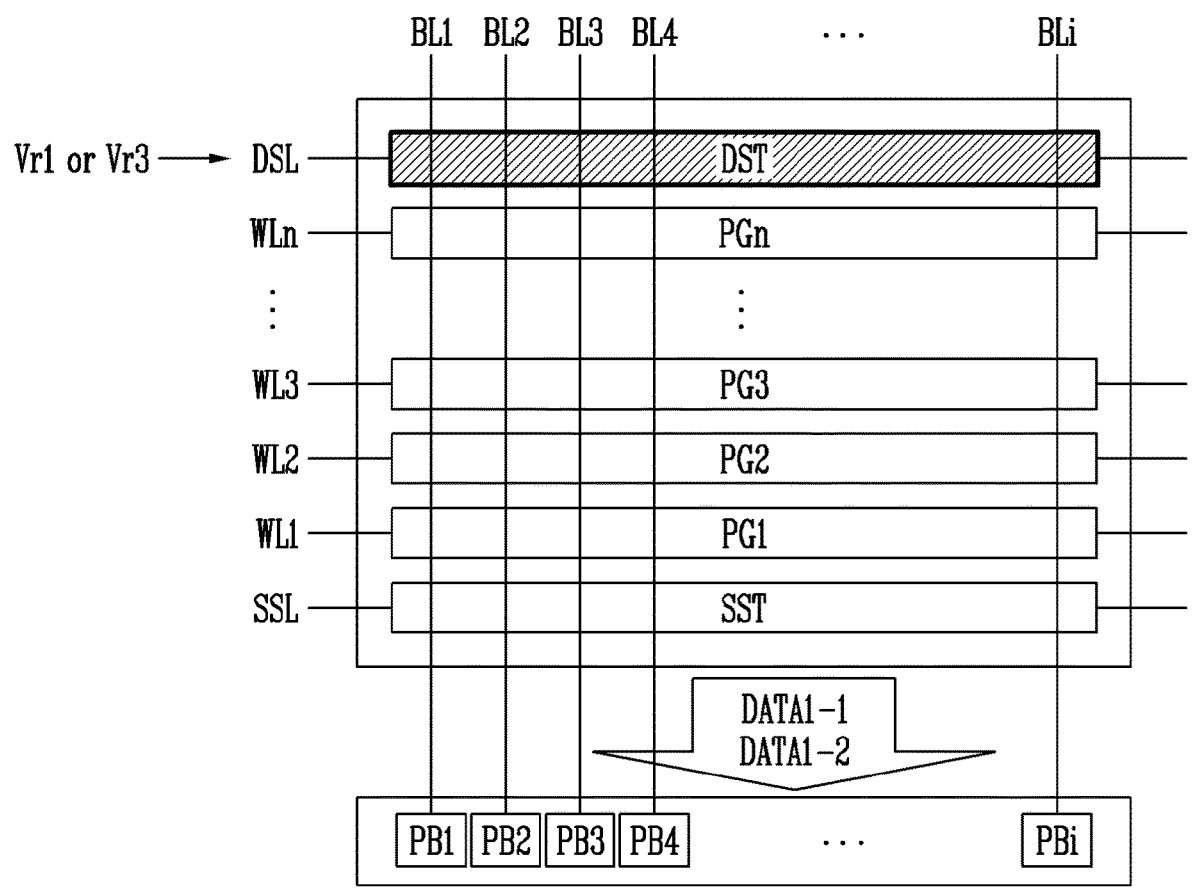
FIG. 15 is a diagram illustrating a first check operation according to an embodiment of the present disclosure.

FIG. 15 is a diagram illustrating a first check operation according to an embodiment of the present disclosure.

Referring to FIG. 15, drain selection transistors DST included in a memory block may be coupled to first to i-th bit lines BL1 to BLi, respectively. Since the first check operation is performed as a read operation on the drain selection transistors DST, 1-1-th data DATA1-1 and 1-2-th data DATA1-2 which are sensed during the read operation may be stored in first to i-th page buffers PB1 to PBi coupled to the first to i-th bit lines BL1 to BLi, respectively. An embodiment of an operation in which the 1-1-th data DATA1-1 and the 1-2-th data DATA1-2 are stored in the first to i-th page buffers PB1 to PBi will be described below.

Figure 16A:
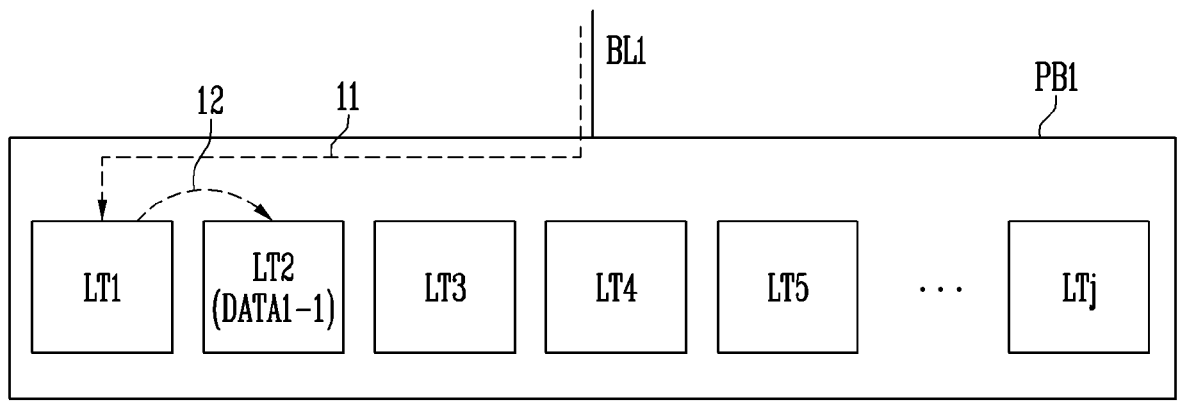
FIGS. 16A and 16B are diagrams for explaining data stored in page buffers during a first check operation.
Figure 16B:
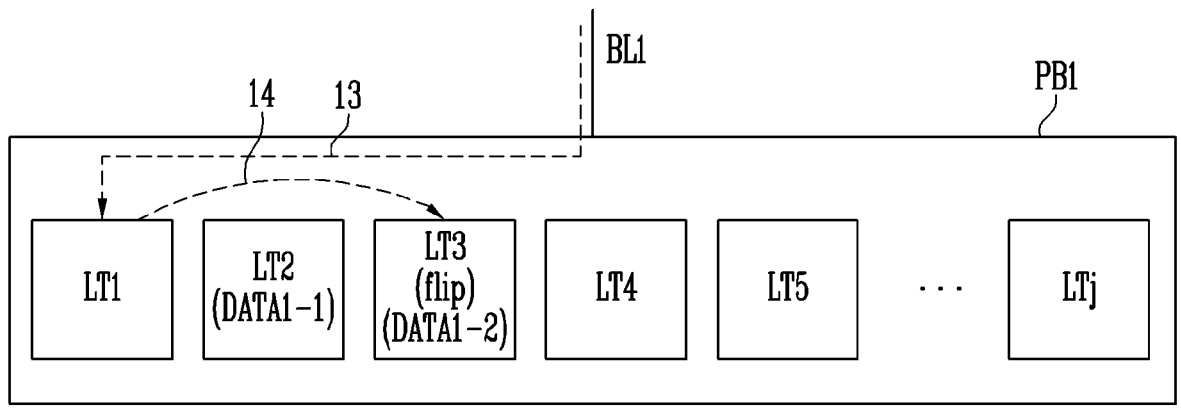

FIGS. 16A and 16B are diagrams for explaining data stored in page buffers during a first check operation, wherein a first page buffer coupled to a first bit line is illustrated as an example.

Referring to FIG. 16A and FIG. 15, the first page buffer PB1 may include first to j-th latches LT1 to LTj. Among the first to j-th latches LT1 to LTj, the first latch LT1 may store data received through a first bit line BL1 during a read operation, and each of the second to j-th latches LT2 to LTj may exchange data stored therein with another latch.

When a first read voltage Vr1 is applied to the drain selection line DSL and then a read operation is performed, data sensed from the corresponding drain selection transistor DST may be stored in the first latch LT1 through the first bit line BL1 (11). Next, the data stored in the first latch LT1 may be transmitted to the second latch LT2 for a subsequent read operation (12). The data transmitted to the second latch LT2 may be data included in 1-1-th data DATA1-1.

Referring to FIGS. 16B and 15, when a third read voltage Vr3 is applied to the drain selection line DSL and then a read operation is performed, data sensed from the corresponding drain selection transistor DST may be stored in the first latch LT1 through the first bit line BL1 (13). Next, the data stored in the first latch LT1 may be transmitted to the third latch LT3 (14). Thereafter, the first page buffer PB1 may flip the data stored in the third latch LT3 in response to page buffer control signals. The flipped data stored in the third latch LT3 may be data included in 1-2-th data DATA1-2.

Figure 17:
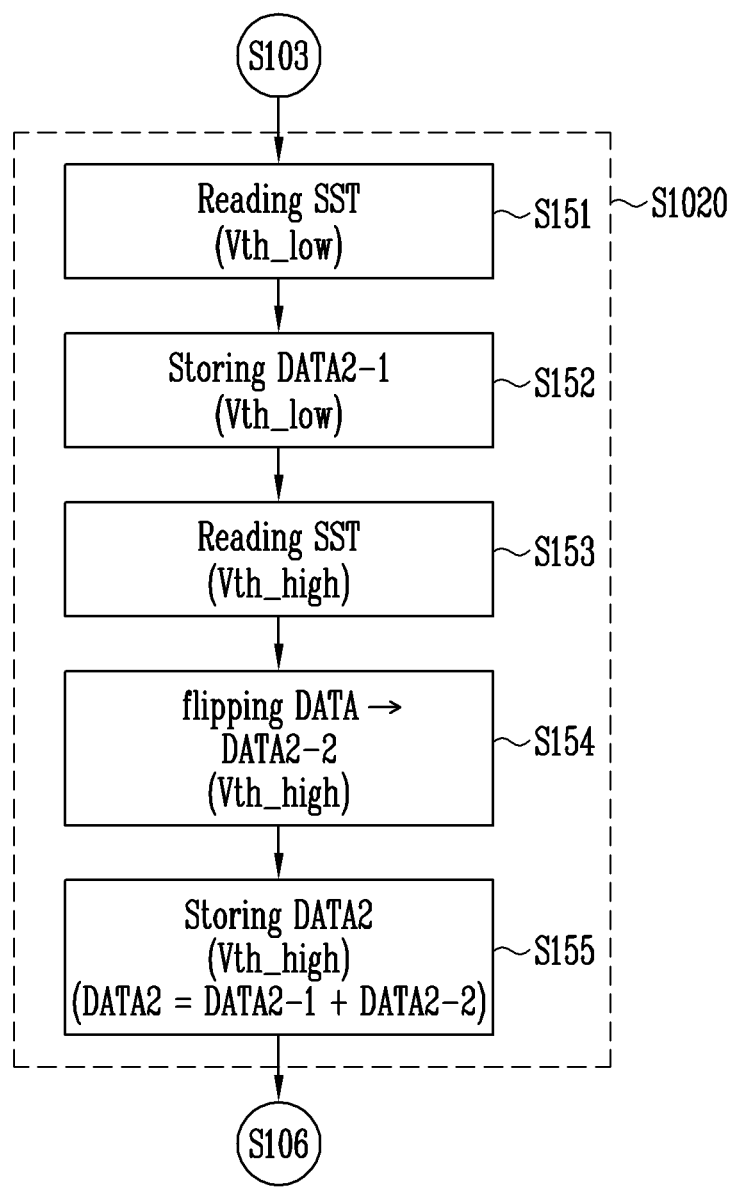
FIG. 17 is a flowchart illustrating in detail a second check operation of FIG. 12.

FIG. 17 is a flowchart illustrating in detail the second check operation of FIG. 12.

Referring to FIG. 17, the second check operation S1020 may be performed to check the threshold voltages of source selection transistors SST included in the memory block.

At step S151, when the second check operation S1020 is initiated, the memory device may perform a read operation of checking low threshold voltages Vth_low, among the threshold voltages of the source selection transistors SST included in the memory block. For example, when a read command is a command based on a multi-level cell (MLC) scheme, the memory device may perform the read operation on the source selection transistors SST by performing a read operation that uses a first read voltage Vr1, as illustrated in FIG. 8. The first read voltage Vr1 may be applied to a source selection line coupled in common to gates of the source selection transistors SST.

At step S152, 2-1-th data DATA2-1 that is sensed during the read operation of checking the low threshold voltages Vth_low of the source selection transistors SST may be temporarily stored in page buffers.

At step S153, the memory device may perform a read operation of checking high threshold voltages Vth_high, among the threshold voltages of the source selection transistors SST included in the memory block. For example, when a read command is a command based on a multi-level cell (MLC) scheme, the memory device may perform the read operation on the source selection transistors SST by performing a read operation that uses a third read voltage Vr3, as illustrated in FIG. 8. The third read voltage Vr3 may be applied to a source selection line coupled in common to gates of the source selection transistors SST.

At step S154, data that is sensed during the read operation of checking the high threshold voltages Vth_high of the source selection transistors SST may be temporarily stored in the page buffers, after which the temporarily stored data may be flipped in the page buffers and then be changed to 2-2-th data DATA2-2.

At step S155, in the page buffers, second data DATA2 including the 2-1-th data DATA2-1 and the 2-2-th data DATA2-2 may be stored.

Figure 18:
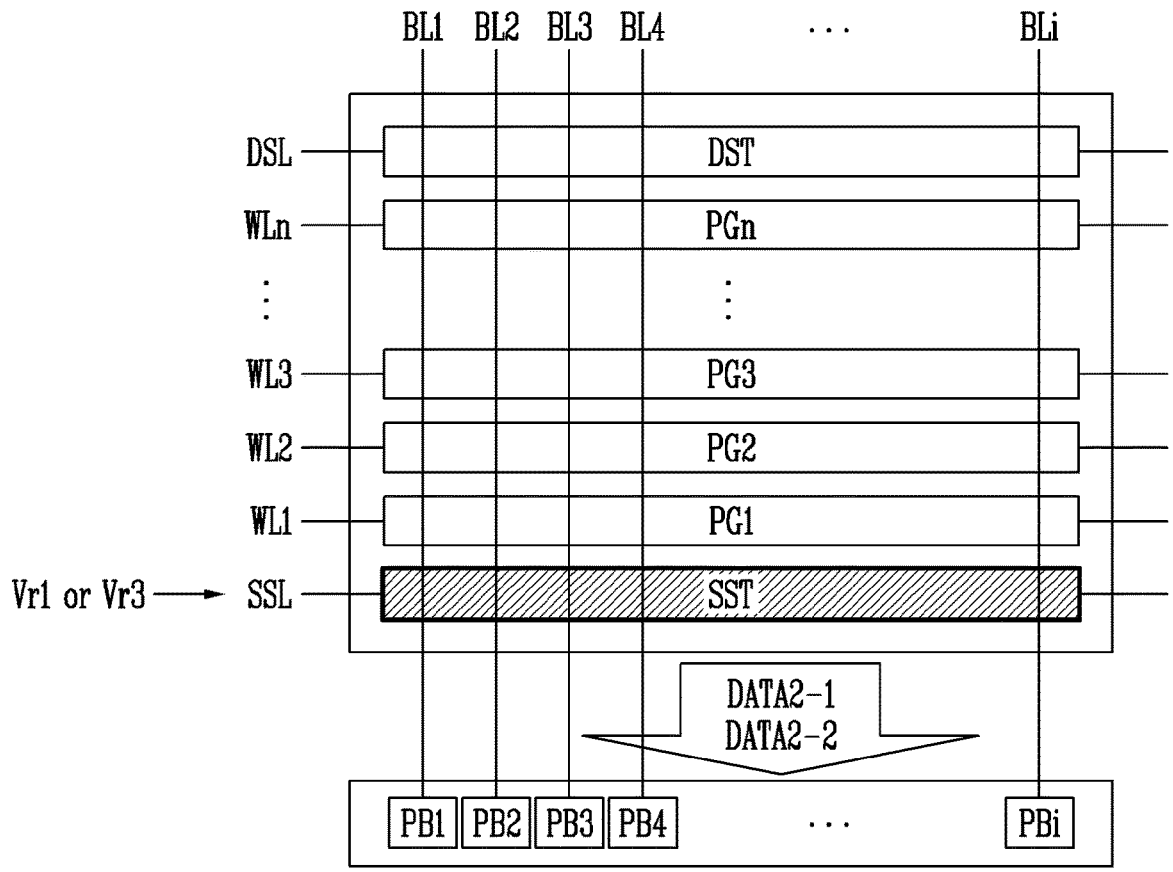
FIG. 18 is a diagram illustrating a second check operation according to an embodiment of the present disclosure.

FIG. 18 is a diagram illustrating a second check operation according to an embodiment of the present disclosure.

Referring to FIG. 18, the second check operation is performed as a read operation on source selection transistors SST, and thus 2-1-th data DATA2-1 and 2-2-th data DATA2-2 which are sensed during the read operation may be stored in first to i-th page buffers PB1 to PBi coupled to first to i-th bit lines BL1 to BLi, respectively. An embodiment of an operation in which the 2-1-th data DATA2-1 and the 2-2-th data DATA2-2 are stored in the first to i-th page buffers PB1 to PBi will be described below.

FIGS. 19A to 19D are diagrams for explaining data stored in page buffers during the second check operation, wherein a first page buffer coupled to a first bit line is illustrated as an example.

Figure 19A:
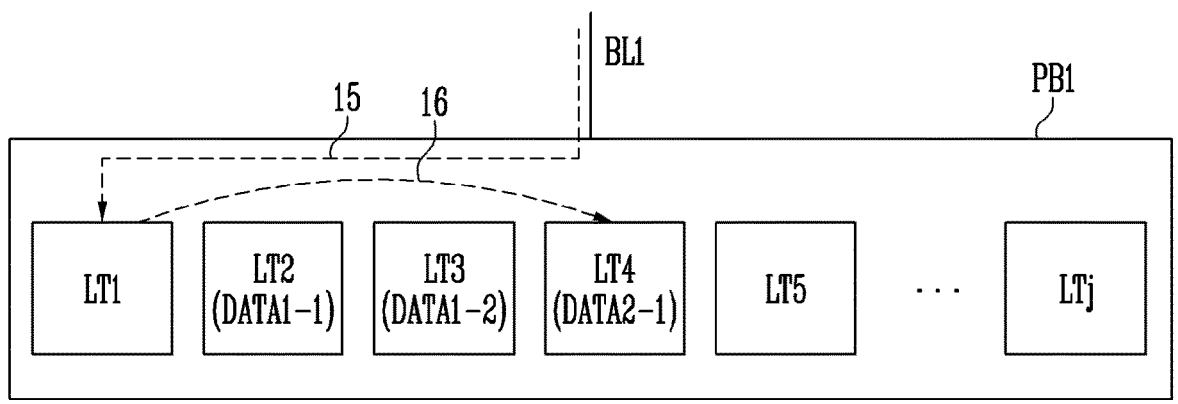
FIGS. 19A to 19D are diagrams for explaining data stored in page buffers during a second check operation.

Referring to FIGS. 19A and 15, in the state in which 1-1-th data and 1-2-th data DATA1-1 and DATA1-2 are stored in second and third latches LT2 and LT3, when a first read voltage Vr1 is applied to the source selection line SSL and then a read operation is performed, data sensed from the source selection transistor SST may be stored in the first latch LT1 through the first bit line BL1 (15). Next, the data stored in the first latch LT1 may be transmitted to the fourth latch LT4 for a subsequent read operation (16). The data transmitted to the fourth latch LT4 may be data included in 2-1-th data DATA2-1.

Figure 19B:
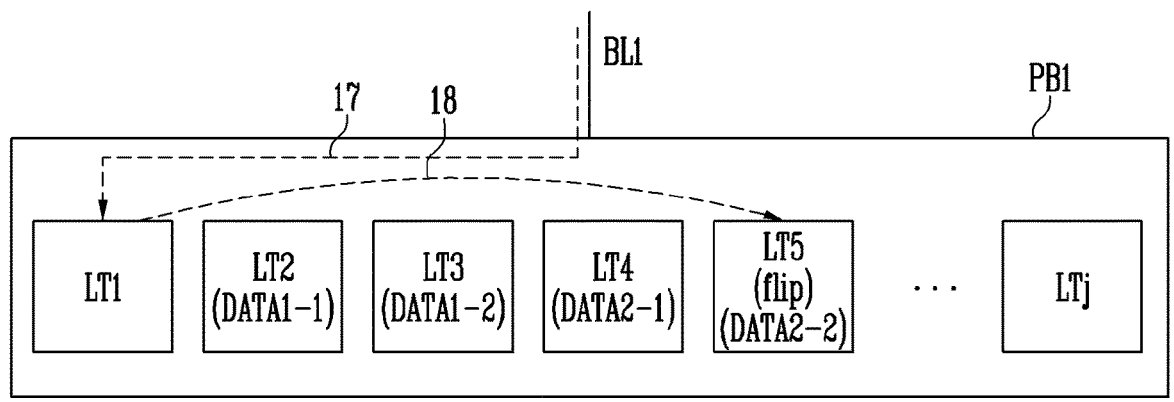

Referring to FIGS. 19B and 15, when a third read voltage Vr3 is applied to the source selection line SSL and then a read operation is performed, data sensed from the corresponding source selection transistor SST may be stored in the first latch LT1 through the first bit line BL1 (17). Next, the data stored in the first latch LT1 may be transmitted to the fifth latch LT5 (18). Thereafter, the first page buffer PB1 may flip the data stored in the fifth latch LT5 in response to page buffer control signals. The flipped data stored in the fifth latch LT5 may be data included in 2-2-th data DATA2-2.

Figure 19C:
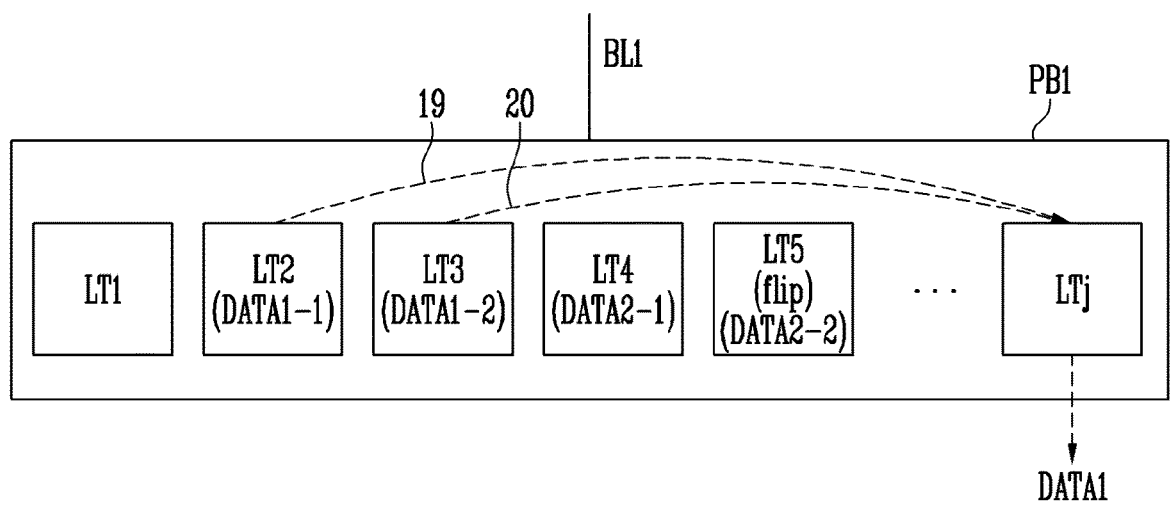

Referring to FIG. 19C, when the second check operation is completed, the first page buffer PB1 may transmit the 1-1-th data DATA1-1 stored in the second latch LT2 to the j-th latch LTj in response to page buffer control signals (19) and may then output the 1-1-th data DATA1-1 as first data DATA1. Next, after the first page buffer PB1 transmits the 1-2-th data DATA1-2, stored in the third latch LT3, to the j-th latch LTj in response to page buffer control signals (20), the first page buffer PB1 may output the 1-2-th data DATA1-2 as first data DATA1. The first data DATA1, output from the first page buffer PB1, may be transmitted to the memory controller through an input/output circuit (e.g., an input/output circuit 150 of FIG. 3).

Figure 19D:
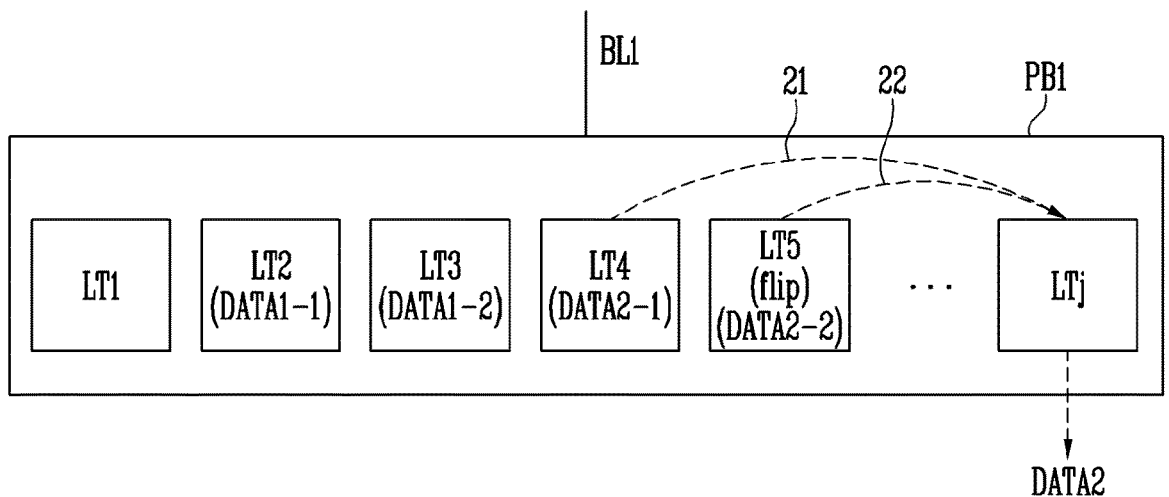

Referring to FIG. 19D, after the first data DATA1 has been output, the first page buffer PB1 may transmit the 2-1-th data DATA2-1, stored in the fourth latch LT4, to the j-th latch LTj in response to page buffer control signals (21), and may then output the 2-1-th data DATA2-1 as second data DATA2. Next, after the first page buffer PB1 transmits the 2-2-th data DATA2-2, stored in the fifth latch LT5, to the j-th latch LTj in response to page buffer control signals (22), the first page buffer PB1 may output the 2-2-th data DATA2-2 as second data DATA2. The second data DATA2, output from the first page buffer PB1, may be transmitted to the memory controller through an input/output circuit (e.g., an input/output circuit 150 of FIG. 3).

Figure 20:
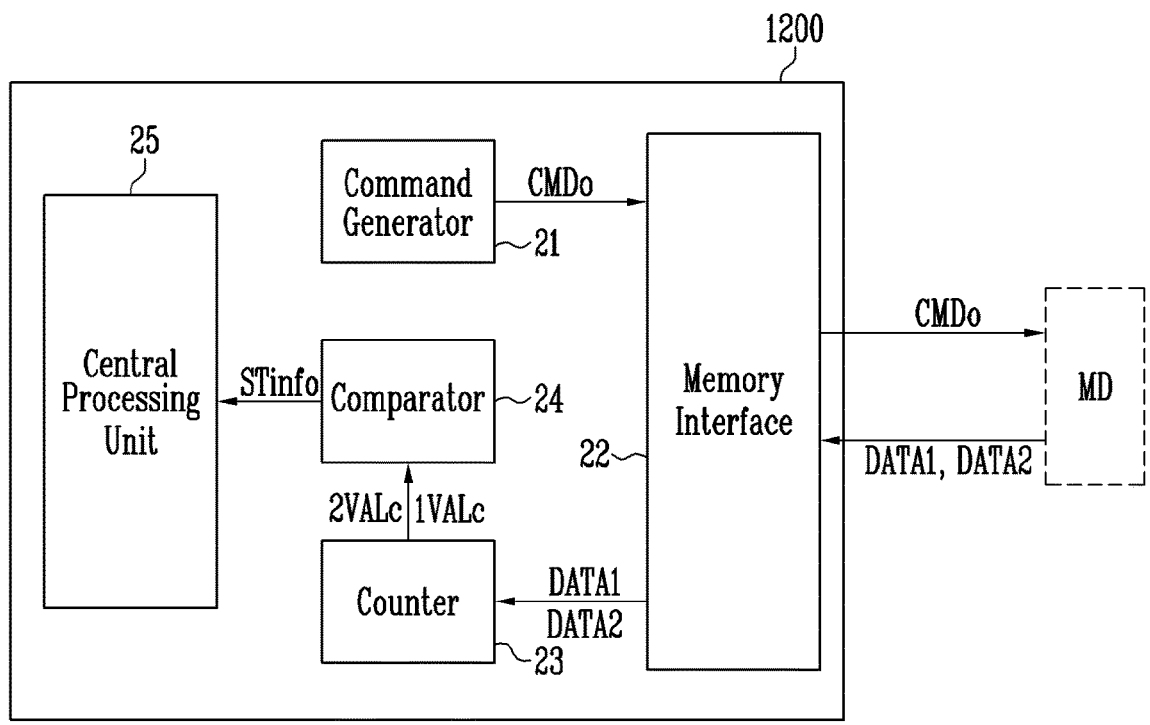
FIG. 20 is a diagram illustrating a method of operating a memory controller according to an embodiment of the present disclosure.

FIG. 20 is a diagram illustrating a method of operating a memory controller according to an embodiment of the present disclosure.

Referring to FIG. 20, when a read operation performed on a memory device MD is completed, a command generator 21 may generate and output an output command CMDo. The memory interface 22 may transmit the output command CMDo, received from the command generator 21, to the memory device MD. The memory device MD may sequentially output first data DATA1 and second data DATA2 in response to the output command CMDo (see FIGS. 19C and 19D).

The first data DATA1 and the second data DATA2 output from the memory device MD may be received by the memory interface 22, and the memory interface 22 may sequentially transmit the first data DATA1 and the second data DATA2 to the counter 23.

The counter 23 may count the number of fail bits included in the first data DATA1 and output a first count value 1VALc and may count the number of fail bits included in the second data DATA2 and output a second count value 2VALc. For example, when a fail bit is defined to have the value '1' between '0' and '1' included in the first and second data DATA1 and DATA2, the counter 23 may count the number of bits having the value '1' included in each of the first data DATA1 and the second data DATA2 and output the first and second count values 1VALc and 2VALc.

The comparator 24 may individually compare the first and second count values 1VALc and 2VALc with a reference value and may generate and output the status information STinfo of the corresponding memory block based on the result of the comparison. For example, when the first or second count value 1VALc or 2VALc is greater than the reference value, the comparator 24 may output status information STinfo indicating bad status, whereas when the first and second count values 1VALc and 2VALc are less than or equal to the reference value, the comparator 24 may output status information STinfo indicating normal status. Alternatively, the comparator 24 may generate and output the status information STinfo corresponding to various states depending on the first and second count values 1VALc and 2VALc.

The central processing unit 25 may update the status of the memory block depending on the status information STinfo and may manage the memory block based on the updated status.

Figure 21A:
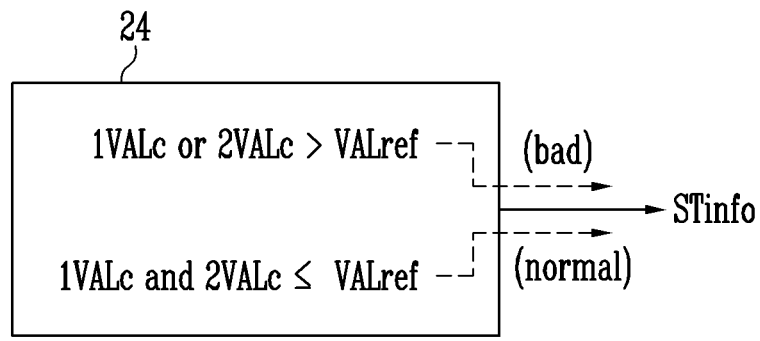
FIGS. 21A and 21B are diagrams illustrating various embodiments of a comparator.
Figure 21B:
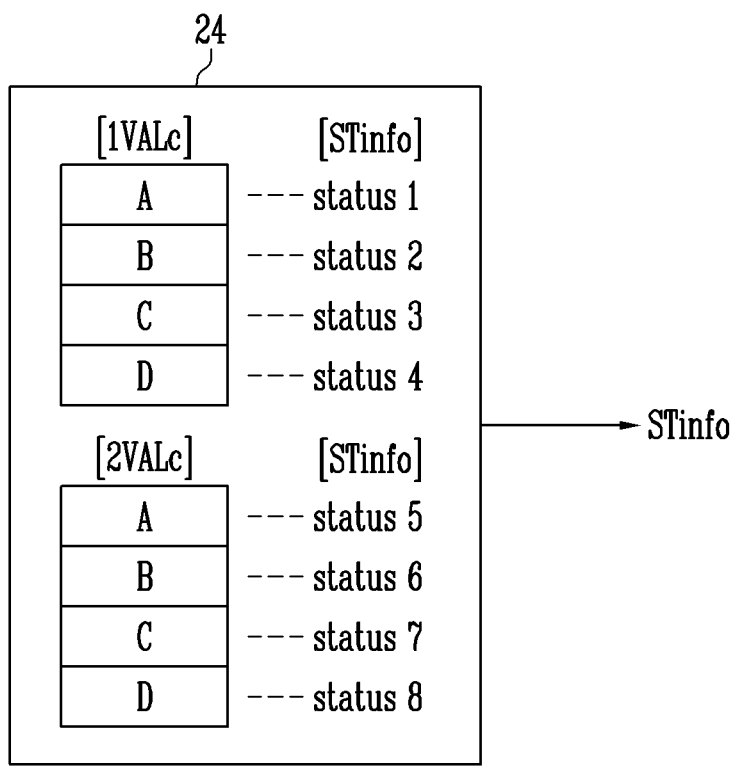

FIGS. 21A and 21B are diagrams illustrating various embodiments of a comparator.

Referring to FIG. 21A, the comparator 24 may individually compare first and second count values 1VALc and 2VALc with a reference value, and may output status information STinfo indicating that the corresponding memory block is in bad status or normal status based on the result of the comparison. For example, when the first or second count value 1VALc or 2VALc is greater than the reference value, the comparator 24 may output status information STinfo indicating bad status, whereas when the first and second count values 1VALc and 2VALc are less than or equal to the reference value, the comparator 24 may output status information STinfo indicating normal status.

Referring to FIG. 21B, unlike the comparator 24 illustrated in FIG. 21A, the comparator 24 illustrated in FIG. 21B may generate and output status information STinfo corresponding to various states status A to status 8 depending on the first and second count values 1VALc and 2VALc. For example, the comparator 24 may include a table in which the first and second count values 1VALc and 2VALc are classified into a plurality of ranges A to D and a table which includes states status 1 to status 8 corresponding to respective ranges. When the first and second count values 1VALc and 2VALc are input, the comparator 24 may output status information STinfo including both status corresponding to a range within which the first count value 1VALc falls and status corresponding to a range within which the second count value 2VALc falls.

Figure 22:
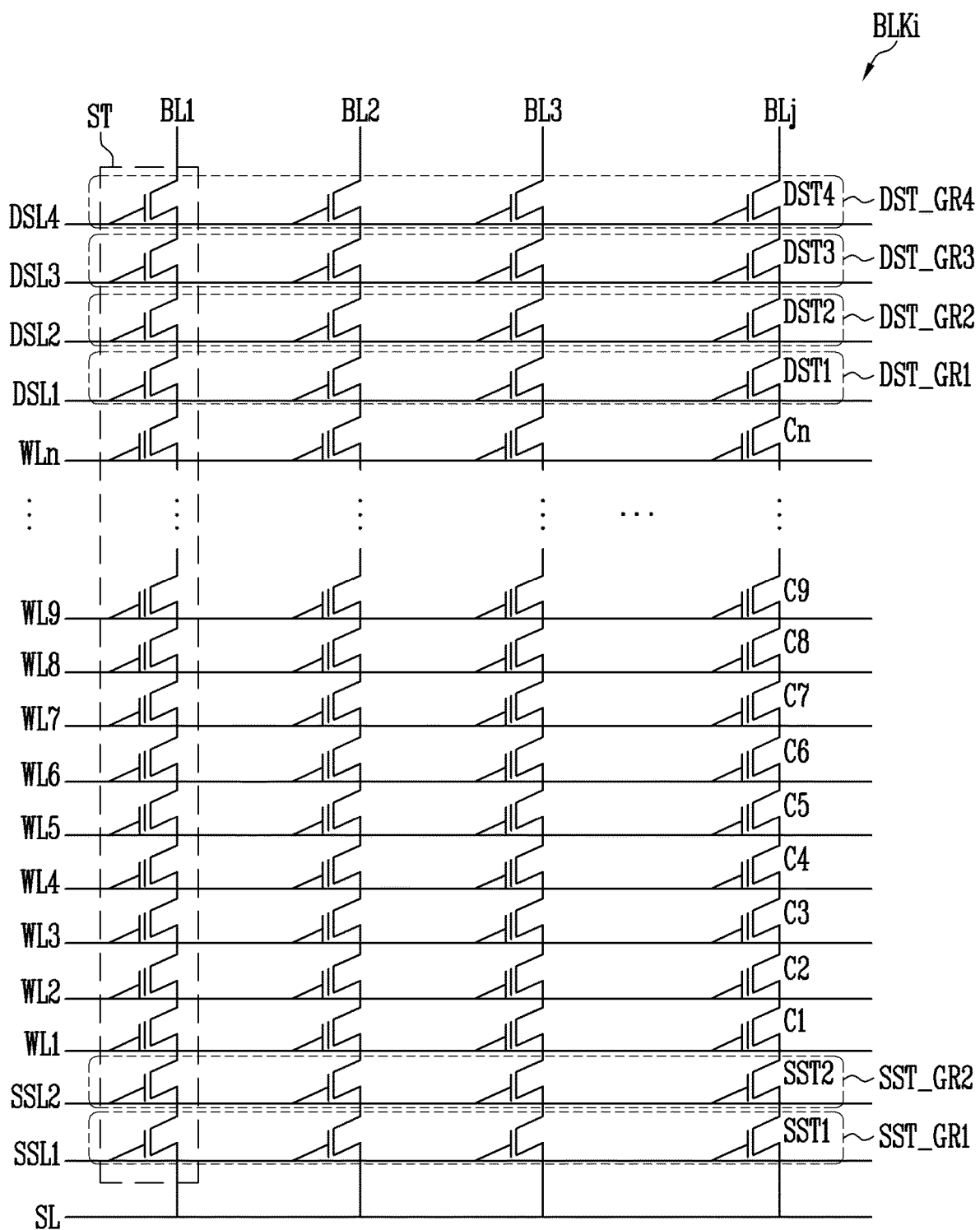
FIG. 22 is a diagram illustrating an embodiment of the memory block of FIG. 3.

FIG. 22 is a diagram illustrating an embodiment of the memory block of FIG. 3. Referring to FIG. 22, an i-th memory block BLKi according to an embodiment may include a plurality of drain selection transistor groups DST_GR1 to DST_GR4 and a plurality of source selection transistor groups SST_GR1 and SST_GR2. For example, each of strings ST may include first to fourth drain selection transistors DST1 to DST4 and first and second source selection transistors SST1 and SST2. The first to fourth drain selection transistors DST1 to DST4 may be sequentially coupled between n-th memory cells Cn and first to j-th bit lines BL1 to BLj, and the first and second source selection transistors SST1 and SST2 may be sequentially coupled between a source line SL and first memory cells C1.

The first drain selection transistors DST1 may be included in the first drain selection transistor group DST_GR1, and gates of the first drain selection transistors DST1 may be coupled to a first drain selection line DSL1. In this way, the first to fourth drain selection transistors DST1 to DST4 may form first to fourth drain selection transistor groups DST_GR1 to DST_GR4, and the first to fourth drain selection transistors DST_GR1 to DST_GR4 may be coupled to first to fourth drain selection lines DSL1 to DSL4, respectively. Different voltages may be applied to the first to fourth drain selection lines DSL1 to DSL4.

The first source selection transistors SST1 may be included in the first source selection transistor group SST_GR1, and gates of the first source selection transistors SST1 may be coupled to a first source selection line SSL1. The second source selection transistors SST2 may be included in the second source selection transistor group SST_GR2, and gates of the second source selection transistors SST2 may be coupled to a second source selection line SSL2. Different voltages may be applied to the first and second source selection lines SSL1 and SSL2.

As in the case of the i-th memory block BLKi illustrated in FIG. 22, when the first to fourth drain selection transistors DST1 to DST4 and the first and second source selection transistors SST1 and SST2 are included, a check operation on the selection transistors may be performed for each group.

For example, when the check operation is initiated, respective read operations of checking low threshold voltages and high threshold voltages of the first drain selection transistor group DST_GR1 may be performed, and read data may be temporarily stored in different latches of page buffers. In this way, data read from the first to fourth drain selection transistor groups DST_GR1 to DST_GR4 and data read from the first and second source selection transistor groups SST_GR1 and SST_GR2 may be stored in the page buffers. The order of read operations performed on the selection transistor groups DST_GR1 to DST_GR4 and SST_GR1 and SST_GR2 may change depending on the memory device.

An embodiment of the check operation performed on the plurality of selection transistor groups will be described in detail below.

Figure 23:
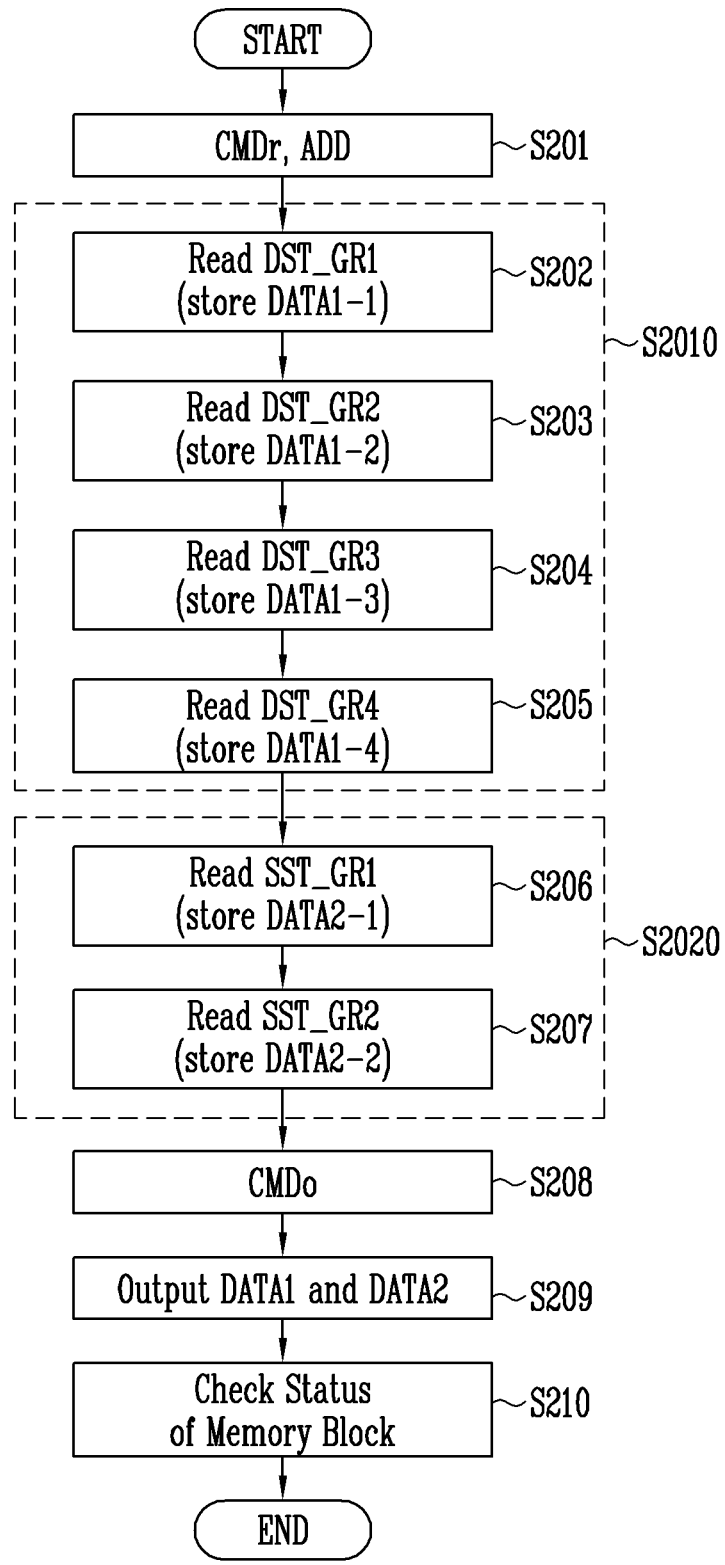
FIG. 23 is a flowchart illustrating in detail a check operation of a memory system including the memory block of FIG. 22.

FIG. 23 is a flowchart illustrating in detail a check operation of a memory system including the memory block of FIG. 22.

Referring to FIG. 23, the check operation on the plurality of selection transistor groups may be performed in a way similar to that of the embodiment described above with reference to FIG. 12. Therefore, repeated descriptions of components overlapping the embodiment described above with reference to FIG. 12 are omitted.

At step S201, a memory controller included in the memory system may generate a read command CMDr and an address ADD and may transmit the read command CMDr and the address ADD to a memory device.

The memory device may sequentially perform a first check operation S2010 on drain selection transistors included in a selected memory block and a second check operation S2020 on source selection transistors included in the selected memory block in response to the read command CMDr and the address ADD. An embodiment of the first check operation S2010 performed on the drain selection transistors DST is described in detail below.

At step S202, the memory device may perform a read operation of checking low threshold voltages Vth_low and high threshold voltages Vth_high of the first drain selection transistor group DST_GR1 included in the selected memory block and may store the read 1-1-th data DATA1-1 in page buffers. For example, the memory device may store data that is read during a read operation for the low threshold voltages Vth_low in the page buffers without change and may flip data that is read during a read operation for the high threshold voltages Vth_high and store the flipped data in the page buffers.

At step S203, when step S202 is completed, the memory device may perform a read operation of checking the low threshold voltages Vth_low and high threshold voltages Vth_high of the second drain selection transistor group DST_GR2 included in the selected memory block and may store read 1-2-th data DATA1-2 in the page buffers. For example, the memory device may store data that is read during a read operation for the low threshold voltages Vth_low in the page buffers without change and may flip data that is read during a read operation for the high threshold voltages Vth_high and store the flipped data in the page buffers.

At step S204, when step S203 is completed, the memory device may perform a read operation of checking the low threshold voltages Vth_low and high threshold voltages Vth_high of the third drain selection transistor group DST_GR3 included in the selected memory block and may store read 1-3-th data DATA1-3 in the page buffers. For example, the memory device may store data that is read during a read operation for the low threshold voltages Vth_low in the page buffers without change and may flip data that is read during a read operation for the high threshold voltages Vth_high and store the flipped data in the page buffers.

At step S205, when step S204 is completed, the memory device may perform a read operation of checking the low threshold voltages Vth_low and high threshold voltages Vth_high of the fourth drain selection transistor group DST_GR4 included in the selected memory block and may store read 1-4-th data DATA1-4 in the page buffers. For example, the memory device may store data that is read during a read operation for the low threshold voltages Vth_low in the page buffers without change and may flip data that is read during a read operation for the high threshold voltages Vth_high and store the flipped data in the page buffers.

An embodiment of the second check operation S2020 performed on the source selection transistors SST will be described below.

The memory device may perform a read operation of checking low threshold voltages Vth_low and high threshold voltages Vth_high of the first source selection transistor group SST_GR1 included in the selected memory block and may store the read 2-1-th data DATA2-1 in the page buffers at step S206. For example, the memory device may store data that is read during a read operation for the low threshold voltages Vth_low in the page buffers without change and may flip data that is read during a read operation for the high threshold voltages Vth_high and store the flipped data in the page buffers.

At step S207, when step S206 is completed, the memory device may perform a read operation of checking the low threshold voltages Vth_low and high threshold voltages Vth_high of the second source selection transistor group SST_GR2 included in the selected memory block and may store read 2-2-th data DATA2-2 in the page buffers. For example, the memory device may store data that is read during a read operation for the low threshold voltages Vth_low in the page buffers without change and may flip data that is read during a read operation for the high threshold voltages Vth_high and store the flipped data in the page buffers.

At step S208, when the read operation performed on the drain and source selection transistors DST and SST is completed, the memory controller may transmit an output command CMDo to the memory device.

At step S209, the memory device may output the first and second data DATA1 and DATA2, stored in the page buffers, to the memory controller in response to the output command CMDo. The first data DATA1 may include items of data DATA1-1, DATA1-2, DATA1-3, and DATA1-4, stored in the page buffers at step S2010, and the second data DATA2 may include items of data DATA2-1 and DATA2-2, stored in the page buffers at step S2020.

At step S210, the memory controller may count the number of fail bits included in the first and second data DATA1 and DATA2 and may check the status of the memory block depending on the count value.

Figure 24:
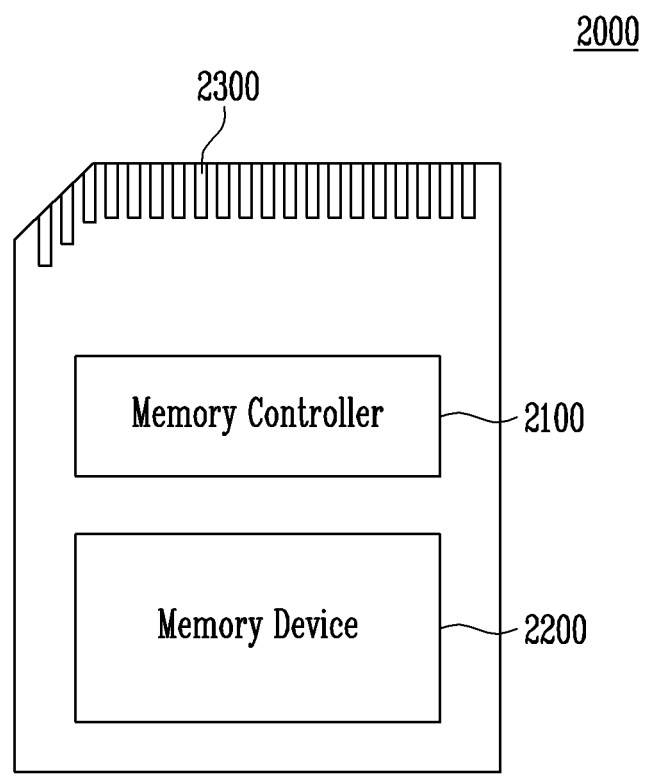
FIG. 24 is a diagram illustrating a memory card system to which a memory device according to the present disclosure is applied.

FIG. 24 is a diagram illustrating a memory card system to which a memory device according to the present disclosure is applied.

Referring to FIG. 24, a memory card system 2000 may include a memory controller 2100, a memory device 2200, and a connector 2300. The memory controller 2100 is coupled to the memory device 2200. The memory controller 2100 may access the memory device 2200. For example, the memory controller 2100 may control a program, a read, or an erase operation of the memory device 2200, or may control a background operation of the memory device 2200. The memory controller 2100 may provide an interface between the memory device 2200 and a host. The memory controller 2100 may run firmware for controlling the memory device 2200. The memory controller 2100 illustrated in FIG. 24 may include devices 21 to 25 included in the memory controller 1200 illustrated in FIG. 2, and the memory device 2200 may be configured, for example, in the same manner as the memory device MD illustrated in FIG. 3.

The memory controller 2100 may communicate with an external device through the connector 2300. The memory controller 2100 may communicate with an external device (e.g., a host) based on a specific communication protocol. In an embodiment, the memory controller 2100 may communicate with the external device through at least one of various interface protocols such as universal serial bus (USB), multimedia card (MMC), embedded MMC (eMMC), peripheral component interconnection (PCI), PCI-express (PCI-E), an advanced technology attachment (ATA) protocol, a serial-ATA (SATA), parallel-ATA (PATA), small computer system interface (SCSI), enhanced small disk interface (ESDI), integrated drive electronics (IDE), firewire, universal flash storage (UFS), WIFI, Bluetooth, and nonvolatile memory express (NVMe) protocols. In an embodiment, the connector 2300 may be defined by at least one of the above-described various communication protocols.

In an embodiment, the memory device 2200 may be implemented as any of various nonvolatile memory devices, such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-transfer torque magnetic RAM (STT-MRAM).

The memory controller 2100 and the memory device 2200 may be integrated into a single semiconductor device to form a memory card. For example, the memory controller 2100 and the memory device 2200 may be integrated into a single semiconductor device to form a memory card such as a personal computer memory card international association (PCMCIA), a compact flash card (CF), a smart media card (SM or SMC), a memory stick multimedia card (MMC, RS-MMC, MMCmicro or eMMC), a SD card (SD, miniSD, microSD, or SDHC), or a universal flash storage (UFS).

Figure 25:
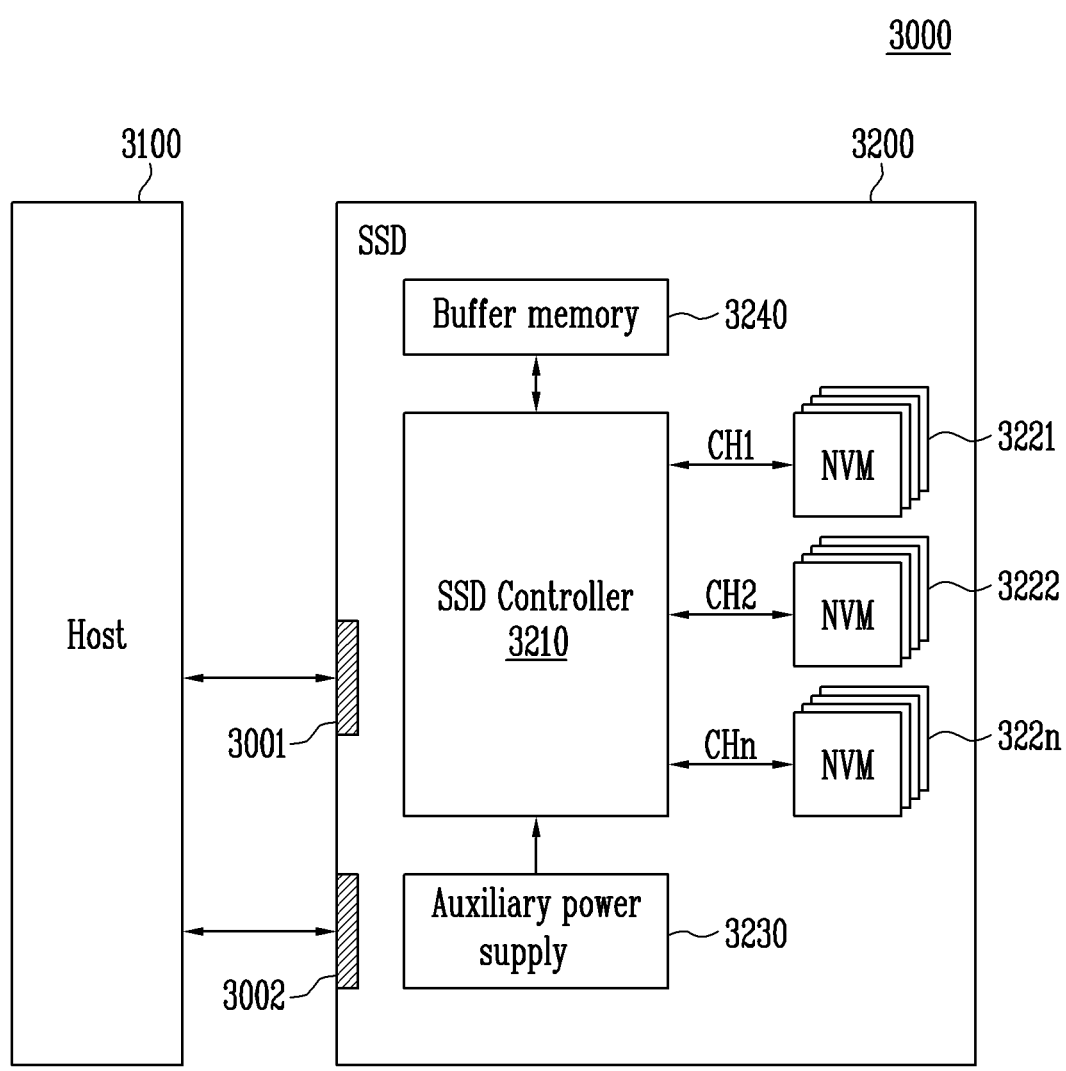
FIG. 25 is a diagram illustrating a solid state drive (SSD) system to which a memory device according to the present disclosure is applied.

FIG. 25 is a diagram illustrating a solid state drive (SSD) system to which a memory device according to the present disclosure is applied.

Referring to FIG. 25, an SSD system 3000 includes a host 3100 and an SSD 3200. The SSD 3200 may exchange a signal with the host 3100 through a signal connector 3001, and may receive a power voltage through a power connector 3002. The SSD 3200 may include an SSD controller 3210, a plurality of nonvolatile memories 3221 to 322n, an auxiliary power supply 3230, and a buffer memory 3240. The nonvolatile memories 3221 to 322n illustrated in FIG. 25 may be configured in the same manner as the memory device MD illustrated in FIG. 3. The SSD controller 3210 illustrated in FIG. 25 may include devices 21 to 25 included in the memory controller 1200 illustrated in FIG. 2.

The SSD controller 3210 may control the plurality of nonvolatile memories 3221 to 322n in response to signals received from the host 3100. In an embodiment, the signals may be signals based on the interfaces of the host 3100 and the SSD 3200. For example, such a signal may be a signal defined by at least one of various interfaces such as universal serial bus (USB), multimedia card (MMC), embedded MMC (eMMC), peripheral component interconnection (PCI), PCI-express (PCI-E), an advanced technology attachment (ATA), serial-ATA (SATA), parallel-ATA (PATA), small computer system interface (SCSI), enhanced small disk interface (ESDI), integrated drive electronics (IDE), firewire, universal flash storage (UFS), WiFi, Bluetooth, and nonvolatile memory express (NVMe) interfaces.

The auxiliary power supply 3230 may be coupled to the host 3100 through the power connector 3002. The auxiliary power supply 3230 may be supplied with power from the host 3100, and may be charged. The auxiliary power supply 3230 may supply the power of the SSD 3200 when the supply of power from the host 3100 is not smoothly performed. In an embodiment, the auxiliary power supply 3230 may be located inside the SSD 3200 or located outside the SSD 3200. For example, the auxiliary power supply 3230 may be located in a main board, and may also provide auxiliary power to the SSD 3200.

The buffer memory 3240 functions as a buffer memory of the SSD 3200. For example, the buffer memory 3240 may temporarily store data received from the host 3100 or data received from the plurality of nonvolatile memories 3221 to 322n, or may temporarily store metadata (e.g., mapping tables) of the nonvolatile memories 3221 to 322n. The buffer memory 3240 may include volatile memories, such as a DRAM, an SDRAM, a DDR SDRAM, and an LPDDR SDRAM or nonvolatile memories, such as an FRAM, a ReRAM, an STT-MRAM, and a PRAM.

In accordance with one or more embodiments, the time required to check the status of a memory device may be shortened by reducing the time required to check selection transistors included in the memory device.

The controllers, processors, devices, managers, components, modules, units, multiplexers, generators, logic, interfaces, decoders, drivers, generators and other signal generating and signal processing features of the embodiments disclosed herein may be implemented, for example, in non-transitory logic that may include hardware, software, or both. When implemented at least partially in hardware, the controllers, processors, devices, managers, components, modules, units, multiplexers, generators, logic, interfaces, decoders, drivers, generators and other signal generating and signal processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, processors, devices, managers, components, modules, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

While the present disclosure has been shown and described with reference to certain exemplary embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the exemplary embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein. The embodiments may be combined to form additional embodiments.

What is claimed is:

1. A memory system, comprising:
   a memory device comprising a memory block and a peripheral circuit, wherein the memory block includes selection transistors and memory cells coupled between a bit line and a source line, and the peripheral circuit is configured to perform a program operation or a read operation; and
   a memory controller configured to:
   transmit a program command based on a single-level cell scheme to the memory device so as to increase threshold voltages of the selection transistors after an erase operation has been performed on the memory block, and
   transmit, to the memory device, a read command to perform a check operation, wherein the read command indicates a first read voltage and a second read voltage higher than the first read voltage, and wherein the check operation includes:
   a check of whether the threshold voltages of the selection transistors fall within a range between the first read voltage and the second read voltage, or
   a check of whether the threshold voltages are lower than the first read voltage or higher than the second read voltage.

2. The memory system according to claim 1, wherein the program command based on the single-level cell scheme includes a command to store one bit of data in one memory cell.

3. The memory system according to claim 1, wherein a read command is based on a higher level cell scheme than the single-level cell scheme, and includes a command corresponding to a program scheme to store two or more bits of data in one memory cell.

4. The memory system according to claim 1, wherein the first and second read voltages are read voltages successively used during a read operation based on a higher level cell scheme than the single-level cell scheme, and
   wherein the peripheral circuit is further configured to:
   generate the first read voltage and the second read voltage in response to the read command,
   store first data that is read from the selection transistors using the first read voltage in response to the read command, and
   flip data that is read from the selection transistors using the second read voltage in response to the read command and then store the flipped data as second data.

5. The memory system according to claim 4, wherein the peripheral circuit is further configured to set, to fail bits, the first data read from the selection transistors having the threshold voltages lower than the first read voltage and the second data read from the selection transistors having the threshold voltages equal to or higher than the second read voltage.

6. The memory system according to claim 5, wherein the memory controller is further configured to:
   receive the first data and the second data from the memory device, and
   check a status of the memory block depending on a number of the fail bits among the first data and the second data read from the selection transistors.

7. The memory system according to claim 6, wherein the memory controller checks the status by:
   processing the memory block as a bad block when the number of fail bits is greater than a reference number of fail bits, and
   processing the memory block as a normal block when the number of fail bits is less than or equal to the reference number of fail bits.

8. The memory system according to claim 6, wherein the memory controller is further configured to generate various types of status information of the memory block depending on the number of fail bits.

9. The memory system according to claim 1,
   wherein the peripheral circuit includes:
   a voltage generator configured to generate the first and second read voltages to be applied to gates of the selection transistors; and
   page buffers configured to store data read from the selection transistors, and
   wherein the memory device further comprises a logic circuit configured to control the peripheral circuit in response to the program or read command.

10. The memory system according to claim 1, wherein the memory controller comprises:
    a command generator configured to selectively generate the program command based on the single-level cell scheme or the read command based on a higher level cell scheme than the single-level cell scheme;
    a memory interface configured to transmit the program and read commands to the memory device and receive data output from the memory device;
    a counter configured to count a number of fail bits included in the data received by the memory interface and output a count value;
    a comparator configured to compare the count value with a reference value and output status information of the memory block based on a result of the comparison; and
    a processor configured to process the memory block as a bad block or a normal block depending on the status information.

11. A memory system, comprising:
    a memory device comprising a memory block and a peripheral circuit, wherein the memory block includes selection transistors and memory cells coupled between a bit line and a source line and the peripheral circuit is configured to program or read the selection transistors; and a memory controller configured to transmit a command to check threshold voltage distributions of the selection transistors to the memory device, wherein the peripheral circuit is further configured to store first data that is read from the selection transistors using a first read voltage and configured to flip data that is read from the selection transistors using a second read voltage higher than the first read voltage and store flipped data as second data, in response to the command, and wherein the memory controller is further configured to, when the first data and the second data are output from the memory device, check a status of the memory block depending on a number of fail bits included in the first data and the second data.

12. The memory system according to claim 11, wherein the peripheral circuit comprises:
a voltage generator configured to generate the first and second read voltages to be applied to gates of the selection transistors in response to a voltage code;
page buffers configured to store the first and second data read from the selection transistors in response to page buffer control signals; and
a logic circuit configured to output the voltage code so that the voltage generator generates the first and second read voltages and output the page buffer control signals so that the page buffers store the first data and the second data, in response to the command.

13. The memory system according to claim 12, wherein:
each of the page buffers comprises a plurality of latches, and
each of the page buffers is configured to:
store data that is read using the first or second read voltage in a first latch, among the plurality of latches,
receive the data that is read from the first latch using the first read voltage and store the received data as the first data in a second latch, among the plurality of latches,
receive the data that is read from the first latch using the second read voltage and store the flipped data of the received data as the second data in a third latch, among the plurality of latches, and
output the first or second data received from the second or third latch to the memory controller through a fourth latch, among the plurality of latches.

14. The memory system according to claim 11, wherein the memory controller comprises:
a command generator configured to generate the command;
a memory interface configured to transmit the command to the memory device and receive the first data and the second data output from the memory device;
a counter configured to count a number of fail bits included in the first data and the second data received by the memory interface and output a count value;
a comparator configured to compare the count value with a reference value and output status information of the memory block based on a result of the comparison; and
a processor configured to process the memory block as a bad block or a normal block based on the status information.

15. The memory system according to claim 14, wherein the command generator is configured to output a read command as the command so as to check a status of the selection transistors.

16. The memory system according to claim 15, wherein the read command is set to a command based on a multiple-level cell scheme used for reading two or more bits of data from a memory cell.

17. The memory system according to claim 14, wherein the fail bits correspond to the first or second data that are read from selection transistors having threshold voltages lower than the first read voltage or threshold voltages equal to or higher than the second read voltage, among the selection transistors.

18. The memory system according to claim 14, wherein the comparator is configured to:
include information indicating a bad block in the status information when the count value is greater than the reference value, and
include information indicating a normal block in the status information when the count value is less than or equal to the reference value.

19. The memory system according to claim 14, wherein the comparator is configured to divide count values into various ranges and output the status information having different items of information depending on respective ranges.

20. The memory system according to claim 14, wherein the processor is configured to:
store the status information corresponding to the memory block, and
output a control signal depending on the status information during a subsequent operation to be performed on the memory block.

* * * * *